(12) United States Patent
Burak et al.

(10) Patent No.: US 11,489,510 B2
(45) Date of Patent: *Nov. 1, 2022

(54) BULK ACOUSTIC WAVE RESONATOR WITH PIEZOELECTRIC LAYER COMPRISING LITHIUM NIOBATE OR LITHIUM TANTALATE

(71) Applicant: Avago Technologies International Sales Pte. Limited, Singapore (SG)

(72) Inventors: Dariusz Burak, Fort Collins, CO (US); Kevin J. Grannen, Thornton, CO (US); John Choy, Westminster, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 1023 days.

This patent is subject to a terminal disclaimer.

(21) Appl. No.: 16/190,701

(22) Filed: Nov. 14, 2018

(65) Prior Publication Data
US 2019/0103853 A1    Apr. 4, 2019

Related U.S. Application Data

(63) Continuation of application No. 15/006,724, filed on Jan. 26, 2016, now Pat. No. 10,164,605.

(51) Int. Cl.
*H03H 9/17* (2006.01)
*H03H 3/04* (2006.01)

(52) U.S. Cl.
CPC ............. *H03H 9/175* (2013.01); *H03H 3/04* (2013.01); *H03H 9/173* (2013.01); *H03H 2003/0428* (2013.01)

(58) Field of Classification Search
CPC .......... H03H 9/175; H03H 9/173; H03H 3/04; H03H 2003/0428
See application file for complete search history.

(56) References Cited

U.S. PATENT DOCUMENTS

| | | | |
|---|---|---|---|
| 5,521,454 | A | 5/1996 | Hattori et al. |
| 5,587,620 | A | 12/1996 | Ruby et al. |
| 5,873,153 | A | 2/1999 | Ruby et al. |
| 6,107,721 | A | 8/2000 | Lakin |

(Continued)

OTHER PUBLICATIONS

Swati Shandilyaa et al., "Structural and optical studies on texture LiNbO3 thin film on (0001) sapphire", Indian Journal of Engineering & Materials Sciences, vol. 15, Aug. 2008, pp. 355-357.

(Continued)

*Primary Examiner* — Jeffrey M Shin
(74) *Attorney, Agent, or Firm* — Foley & Lardner LLP

(57) ABSTRACT

A bulk acoustic wave (BAW) resonator includes a substrate defining a cavity, a bottom electrode disposed over the substrate and the cavity, a piezoelectric layer disposed on the bottom electrode, and a top electrode disposed on the piezoelectric layer. The piezoelectric layer includes polycrystalline lithium niobate (LN) material or polycrystalline lithium tantalite (LT) material. The BAW resonator may further include an encapsulant layer formed on side and top surfaces of the piezoelectric layer. The encapsulant layer is configured to protect the LN material or the LT material of the piezoelectric layer from a release solvent previously applied to sacrificial material within the cavity in the substrate.

20 Claims, 10 Drawing Sheets

(56) References Cited

U.S. PATENT DOCUMENTS

| | | | |
|---|---|---|---|
| 6,384,697 B1 | 5/2002 | Ruby | |
| 6,507,983 B1 | 1/2003 | Ruby et al. | |
| 6,548,943 B2 | 4/2003 | Kaitila et al. | |
| 7,275,292 B2 | 10/2007 | Ruby et al. | |
| 7,280,007 B2 | 10/2007 | Feng et al. | |
| 7,345,410 B2 | 3/2008 | Grannen et al. | |
| 7,358,831 B2 | 4/2008 | Larson, III et al. | |
| 7,388,454 B2 | 6/2008 | Ruby et al. | |
| 7,466,213 B2 | 12/2008 | Lobl et al. | |
| 7,629,865 B2 | 12/2009 | Ruby | |
| 7,714,684 B2 | 5/2010 | Ruby et al. | |
| 7,986,017 B2 | 7/2011 | Takizawa et al. | |
| 8,248,185 B2 | 8/2012 | Choy et al. | |
| 8,698,376 B2 | 4/2014 | Chen et al. | |
| 8,854,156 B2 * | 10/2014 | Iwashita | H03H 9/605 333/187 |
| 8,902,023 B2 | 12/2014 | Choy et al. | |
| 8,981,876 B2 | 3/2015 | Jamneala et al. | |
| 9,099,983 B2 | 8/2015 | Burak et al. | |
| 9,136,818 B2 | 9/2015 | Burak et al. | |
| 9,203,374 B2 | 12/2015 | Burak et al. | |
| 9,621,126 B2 | 4/2017 | Burak et al. | |
| 10,164,605 B2 * | 12/2018 | Burak | H03H 3/04 |
| 2007/0200458 A1 | 8/2007 | Yoshino et al. | |
| 2008/0246556 A1 | 10/2008 | Heinze et al. | |
| 2010/0327697 A1 | 12/2010 | Choy et al. | |
| 2010/0327994 A1 | 12/2010 | Choy et al. | |
| 2012/0248944 A1 | 10/2012 | Park | |
| 2013/0106534 A1 | 5/2013 | Burak et al. | |
| 2013/0314177 A1 | 11/2013 | Burak et al. | |
| 2014/0111288 A1 | 4/2014 | Nikkei et al. | |
| 2014/0118088 A1 | 5/2014 | Burak et al. | |
| 2014/0118091 A1 | 5/2014 | Burak et al. | |
| 2014/0176261 A1 | 6/2014 | Burak et al. | |
| 2014/0333177 A1 | 11/2014 | Guillou et al. | |
| 2015/0280687 A1 | 10/2015 | Burak et al. | |

OTHER PUBLICATIONS

M. Pijolat et al., "LiNbO3 Film Bulk Acoustic Resonator", 2010 IEEE International Frequency Control Symposium (FCS), 2010, pp. 661-664.

* cited by examiner

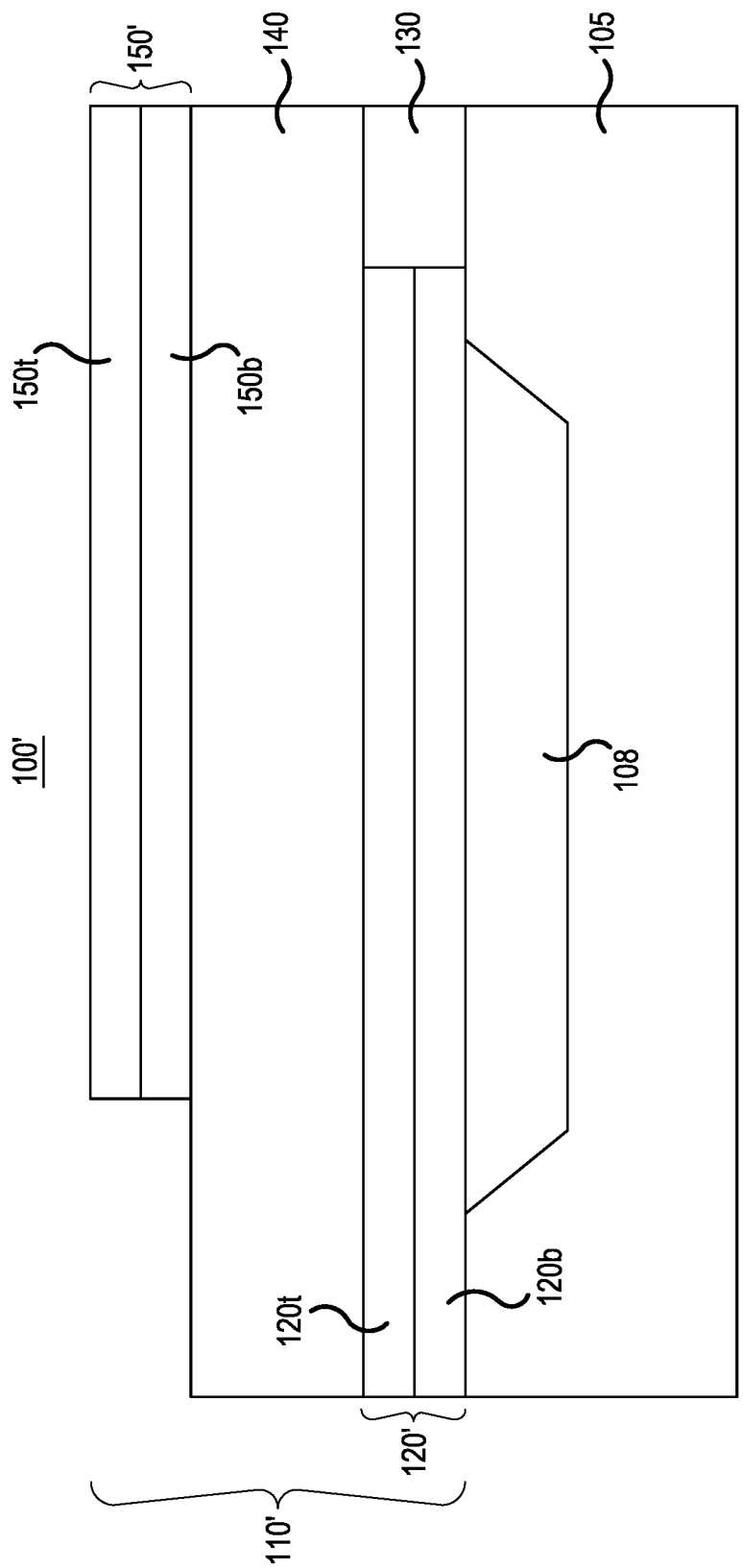

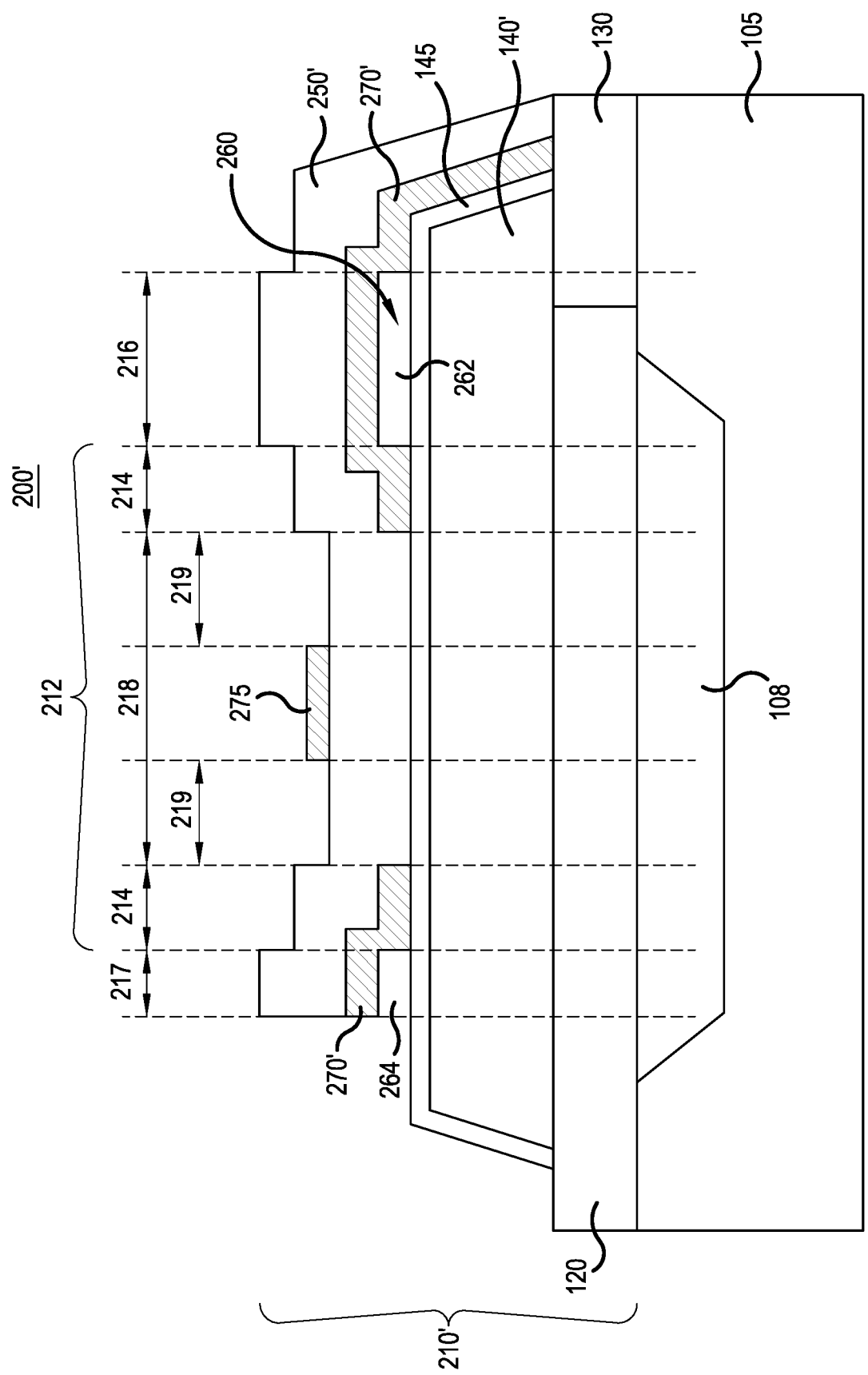

… (1)

BULK ACOUSTIC WAVE RESONATOR WITH PIEZOELECTRIC LAYER COMPRISING LITHIUM NIOBATE OR LITHIUM TANTALATE

CROSS-REFERENCE TO RELATED APPLICATIONS

The present application is a continuation application under 37 C.F.R. § 1.53(b) of U.S. patent application Ser. No. 15/006,724, filed on Jan. 26, 2016. Priority under 35 U.S.C. § 120 is claimed from U.S. patent application Ser. No. 15/006,724, and the entire disclosure of U.S. patent application Ser. No. 15/006,724 is specifically incorporated herein by reference.

BACKGROUND

Acoustic resonators can be used to implement signal processing functions in various electronic applications. For example, some cellular phones and other communication devices use acoustic resonators to implement frequency filters for transmitted and/or received signals. Several different types of acoustic resonators can be used according to different applications, with examples including surface acoustic wave (SAW) resonators and bulk acoustic wave (BAW) resonators.

A typical SAW resonator comprises a layer of piezoelectric material applied to substrate, and electrodes disposed on a surface of the piezoelectric layer. The resonators convert electrical signals to mechanical vibrations on a surface of the piezoelectric layer, and/or mechanical vibrations on the surface of the piezoelectric layer to electrical signals. A conventional SAW resonator may include an interdigital transducer (IDT) electrode disposed on the surface of the piezoelectric layer. The IDT electrode typically includes a first comb electrode comprising a first busbar and multiple first fingers extending from the first busbar, and a second comb electrode comprising a second busbar and multiple second fingers extending from the second busbar in an opposite direction, such that the first and second fingers provide an interleaving pattern. The piezoelectric layer of a SAW resonator is typically formed of lithium niobate (LiNbO$_3$) (hereinafter "LN") or lithium tantalate (LiTaO$_3$) (hereinafter "LT").

BAW resonators include thin film bulk acoustic resonators (FBARs), solidly mounted resonators (SMRs), stacked bulk acoustic resonators (SBARs), double bulk acoustic resonators (DBARs), and coupled resonator filters (CRFs), for example. A typical BAW resonator comprises a layer of piezoelectric material sandwiched between two plate electrodes in a structure referred to as an acoustic stack. Where an input electrical signal is applied between the electrodes, reciprocal or inverse piezoelectric effect causes the acoustic stack to mechanically expand or contract depending on the polarization of the piezoelectric material. As the input electrical signal varies over time, expansion and contraction of the acoustic stack produces acoustic waves (or modes) that propagate through the acoustic resonator in various directions and are converted into an output electrical signal by the piezoelectric effect. Some of the acoustic waves achieve resonance across the acoustic stack, with the resonant frequency being determined by factors such as the materials, dimensions, and operating conditions of the acoustic stack. These and other mechanical characteristics of the acoustic resonator determine its frequency response.

The piezoelectric layer of a BAW resonator is typically formed of aluminum nitride (AlN), zinc oxide (ZnO), or zirconate titanate (PZT), for example. Also, the piezoelectric layer may be "doped" with one or more rare earth elements, such as aluminum nitride (AlN) doped with scandium (Sc) to provide aluminum scandium nitride AlScN (hereinafter "ASN"), for example. LN or LT with c-axes of symmetry aligned vertically are typically not used as the piezoelectric material in conventional BAW resonators due to unacceptably low coupling coefficients kt$^2$ and piezoelectric coupling coefficients e$_{33}$ in communication bands having high RF frequencies (e.g. above 1 GHz). However, the materials used for piezoelectric layers in BAW resonators at high RF frequencies are not particularly efficient at lower frequencies, and require large resonator areas. This is inconsistent with the general design goal of providing smaller devices incorporating BAW resonators.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 1C is a cross-sectional view of a BAW resonator with a piezoelectric layer comprising LN or LT, and composite bottom and top electrodes, according to a representative embodiment.

FIG. 2B is a cross-sectional view of a BAW resonator with lateral performance enhancement features and an encapsulated piezoelectric layer comprising LN or LT, according to a representative embodiment.

DETAILED DESCRIPTION

Figure 1A:
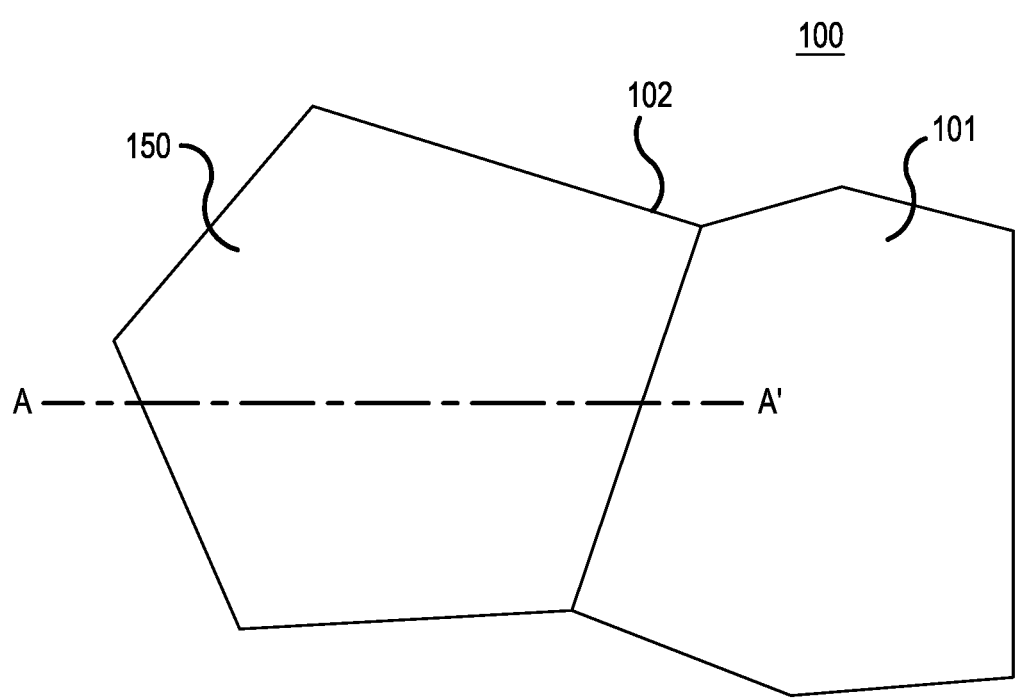
FIG. 1A is a top view of a bulk acoustic wave (BAW) resonator with a piezoelectric layer comprising lithium niobate (LN) or lithium tantalite (LT), according to a representative embodiment.

In the following detailed description, for purposes of explanation and not limitation, example embodiments disclosing specific details are set forth in order to provide a thorough understanding of the present teachings. However, it will be apparent to one having ordinary skill in the art having the benefit of the present disclosure that other embodiments according to the present teachings that depart from the specific details disclosed herein remain within the scope of the appended claims. Moreover, descriptions of well-known apparatuses and methods may be omitted so as to not obscure the description of the example embodiments. Such methods and apparatuses are clearly within the scope of the present teachings.

The terminology used herein is for purposes of describing particular embodiments only, and is not intended to be limiting. The defined terms are in addition to the technical, scientific, or ordinary meanings of the defined terms as commonly understood and accepted in the relevant context.

The terms "a", "an" and "the" include both singular and plural referents, unless the context clearly dictates otherwise. Thus, for example, "a device" includes one device and plural devices. The terms "substantial" or "substantially" mean to within acceptable limits or degree. The term "approximately" means to within an acceptable limit or amount to one of ordinary skill in the art. Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be below that element.

The described embodiments relate generally to bulk acoustic wave (BAW) resonator devices, including thin film bulk acoustic wave resonators (FBARs) and solidly mounted resonators (SMRs), for example, although much of the discussion is directed to FBARs for the sake of convenience. Certain details of acoustic resonator devices, including materials and methods of fabrication, may be found in one or more of the following commonly owned U.S. patents and patent applications: U.S. Pat. No. 6,107,721 to Lakin; U.S. Pat. Nos. 5,587,620, 5,873,153, 6,507,983, 6,384,697, 7,275,292 and 7,629,865 to Ruby et al.; U.S. Pat. No. 7,280,007 to Feng, et al.; U.S. Pat. No. 8,981,876 to Jamneala et al.; U.S. Pat. No. 7,388,454 to Ruby et al.; U.S. Patent App. Pub. No. 2010/0327697 to Choy et al.; U.S. Patent App. Pub. No. 2010/0327994 to Choy et al., U.S. Patent App. Pub. No. 2014/0111288 to Nikkel et al.; U.S. Patent App. Pub. No. 2013/0314177 to Burak et al.; U.S. Patent App. Pub. No. 2014/0118091 to Burak et al.; U.S. Patent App. Pub. No. 2014/0118088 to Burak et al.; U.S. Pat. No. 9,099,983 to Burak et al.; U.S. Pat. No. 7,714,684 to Ruby et al.; and U.S. Pat. No. 6,548,943 to Kaitila et al. The disclosures of these patents and patent applications are hereby specifically incorporated by reference in their entireties. It is emphasized that the components, materials and method of fabrication described in these patents and patent applications are representative and other methods of fabrication and materials within the purview of one of ordinary skill in the art are contemplated.

Intrinsic coupling coefficient $kt^2$ (and therefore piezoelectric layer thickness) is important in determining electrical impedance of a BAW resonator at operating frequency. In general, acoustic resonator is designed to meet a specific characteristic electrical impedance $Z_0$ requirement. The characteristic electrical impedance $Z_0$ is proportional to the resonator area and inversely proportional to the desired frequency of operation and thickness of the piezoelectric layer. The thickness of the piezoelectric layer is predominantly determined by the desired frequency of operation but also by the desired electromechanical coupling coefficient $kt^2$. Within applicable limits, $kt^2$ is proportional to thickness of the piezoelectric layer and inversely proportional to thicknesses of bottom and top electrodes. More specifically, $kt^2$ is proportional to the fraction of acoustic energy stored in the piezoelectric layer and inversely proportional to the fraction of acoustic energy stored in the electrodes. Thus, for a predetermined $Z_0$ the resonator size, and therefore its cost, may be reduced by using piezoelectric material with higher effective $kt^2$, as it allows to use thinner piezoelectric layer (and therefore reduce its area) at the expense of increasing thicknesses of the electrodes in order to maintain the desired resonance frequency. Thus, an acoustic resonator using a high effective $kt^2$ piezoelectric material (e.g., ASN having 9 atomic percentage Sc instead of standard AlN) can be designed to be relatively thin while maintaining desired $kt^2$ of the resonator. Such designs, however, enforce large confinement of acoustic energy into electrodes (typically more than 20%, or so called metal-heavy stacks), which is unfavorable for Rp and Q-factor. Two other important material parameters are dielectric constant and sound velocity, where a higher dielectric constant and a lower sound velocity are better to reduce the resonator area of the BAW resonator.

Use of LN or LT piezoelectric layers in BAW resonator devices, such as FBARs, provides significant advantages in area-savings over use of ASN piezoelectric layers, for example, with respect to low-cost and/or low coupling coefficient $kt^2$. This is particularly the case for BAW resonator operation in low frequency bands (e.g., having uplinks or downlinks less than about 900 MHz). Examples of low frequency bands in which use of LN or LT piezoelectric layers provide significant reduction in resonator area while maintaining good operational characteristics, include frequency band B13 (downlink: 746 MHz-756 MHz; uplink: 777 MHz-787 MHz), frequency band B17 (downlink: 734 MHz-746 MHz; uplink: 704 MHz-716 MHz), frequency band B20 (downlink: 791 MHz-821 MHz; uplink: 832 MHz-862 MHz) and/or frequency band B8 (downlink: 925 MHz-960 MHz; uplink: 880 MHz-915 MHz). For example, when compared to an FBAR with a piezoelectric layer of ASN (where scandium makes up about 9 atomic percent of the piezoelectric material) that has a dielectric constant $\varepsilon_{33}$ of only about 10, an FBAR with a piezoelectric layer of LN formed by sputtering along the c-axis has a dielectric constant $\varepsilon_{33}$ of about 26 and intrinsic coupling coefficient $kt^2$ about 1.5 times smaller. In another example, when compared to an FBAR with a piezoelectric layer of ASN (where scandium makes up about 9 atomic percent of the piezoelectric material) that has a dielectric constant $\varepsilon_{33}$ of only about 10, an FBAR with a piezoelectric layer of c-axis sputtered LT has a dielectric constant $\varepsilon_{33}$ of about 42 and intrinsic coupling coefficient $kt^2$ about 3 times smaller.

Thus, the embodiments described herein relate generally to BAW resonators having c-axis sputtered LN or LT piezoelectric layers. Such piezoelectric layers provide substantial area reduction, e.g., over about 50 percent, of the BAW resonators, with respect to BAW resonators designed for low bands, as compared to conventional BAW resonators having ASN piezoelectric layers, for example.

Figure 1B:
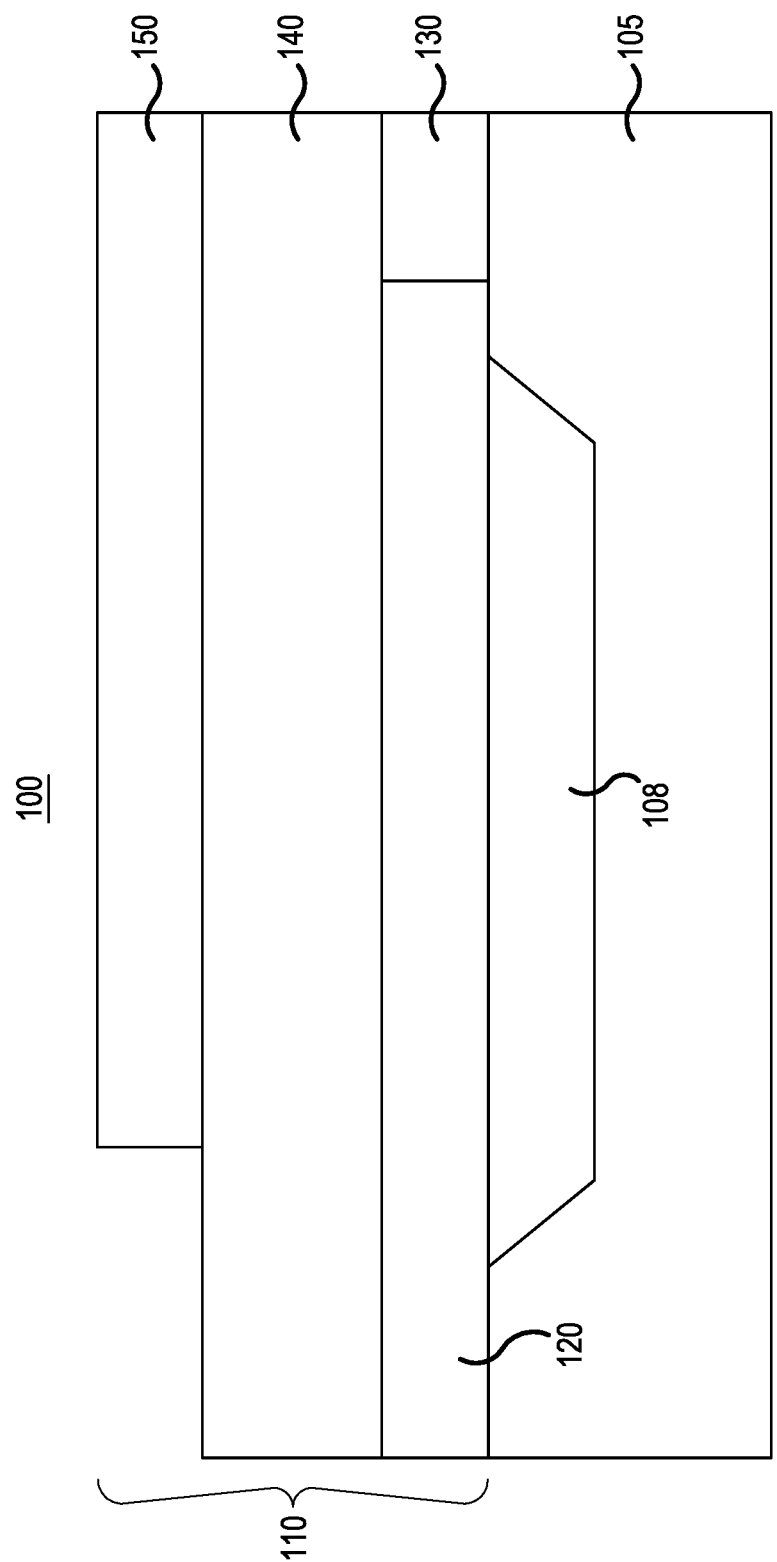
FIG. 1B is a cross-sectional view of a BAW resonator with a piezoelectric layer comprising LN or LT, according to a representative embodiment.

FIG. 1A is a top view of a BAW resonator 100 according to a representative embodiment, and FIG. 1B is a cross-sectional view of BAW resonator 100 in accordance with a representative embodiment. In the depicted embodiment, BAW resonator 100 is an FBAR, although it could take another form, such as a solidly mounted resonator (SMR), or a double bulk acoustic resonator (DBAR), for example.

Referring to FIG. 1A, BAW resonator 100 comprises an acoustic stack having an apodized pentagonal structure, i.e. an asymmetric pentagon, to distribute spurious mode density over a frequency range and to avoid strong excitation of any of spurious modes at any one frequency. In general, acoustic resonator shape is not limited to five sides. For example, common alternative designs include quadrilaterals, hexagons, and other shapes, without departing from the scope of the present teachings. BAW resonator 100 comprises a top (second) electrode 150, a connection side 101, and an interconnect 102. The connection side 101 is configured to provide an electrical connection to interconnect 102. The interconnect 102 provides electrical signals to top electrode 150 to excite desired acoustic waves in a piezoelectric layer (not shown in FIG. 1A) of BAW resonator 100.

Referring to FIG. 1B, BAW resonator 100 comprises a substrate 105 and an acoustic stack 110, in a simplified representation, formed over an air cavity 108 (e.g., "swimming pool"). The substrate 105 may be formed of various types of semiconductor materials compatible with semiconductor processes, such as silicon (Si), gallium arsenide (GaAs), indium phosphide (InP), or the like, which may be useful for integrating connections and electronics, dissipating heat generated from the resonator, generally reducing size and cost of the BAW resonator 100, and also enhancing performance. In the depicted embodiment, the air cavity 108 defined by the substrate 105 is located below acoustic stack 110 to allow free vibration of acoustic stack 110 during operation.

The air cavity 108 is typically formed by etching substrate 105 and depositing a sacrificial material therein prior to formation of acoustic stack 110, thereby filling the cavity 108 with the sacrificial material, and subsequently removing the sacrificial material, e.g., by wet or dry release process, subsequent to the formation of acoustic stack 110. Types of sacrificial material may include one or more of various materials, such as silicon dioxide ($SiO_2$), phosphorous silicon glass (PSG), and the like, for example. Various illustrative fabrication techniques for an air cavity in a substrate are described by U.S. Pat. No. 7,345,410 (Mar. 18, 2008), to Grannen et al., which is hereby incorporated by reference in its entirety. As an alternative to air cavity 108, BAW resonator 100 could include an acoustic reflector such as a distributed Bragg reflector (DBR), for example (in which case the acoustic resonator would be an SMR), with acoustic impedance layers having different acoustic impedances, respectively, as discussed below with reference to FIGS. 3A and 3B.

Acoustic stack 110 comprises a bottom (first) electrode 120, a piezoelectric layer 140 formed over the bottom electrode 120, and a top (second) electrode 150 formed over the piezoelectric layer 140. More particularly, the bottom electrode 120 is disposed over the substrate 105 over the air cavity 108, a planarization layer 130 is disposed adjacent to the bottom electrode 120 over the substrate 105, the piezoelectric layer 140 is disposed over the bottom electrode 120 and the planarization layer 130, and a top electrode 150 disposed over the piezoelectric layer 140. So called "dead-FBAR" region may occur on the right side of the BAW resonator 100 structure, where the bottom electrode 120, the piezoelectric layer 140 and the top electrode 150 overlap with the substrate 105. This is a region in which parasitic transducer effect occurs, that is, direct parasitic excitation of acoustic waves in the substrate 105.

Each of the bottom electrode 120 and the top electrode 150 may be formed of a conductive material (e.g., a metal), such as molybdenum (Mo) or tungsten (W), for example. The top electrode 150 may further comprise a passivation layer (not shown), which can be formed of various types of materials, including AlN, silicon carbide (SiC), non-etchable boron-doped silicon glass (NEBSG), silicon dioxide ($SiO_2$), silicon nitride (SiN), polysilicon, and the like. The thickness of the passivation layer should generally be sufficient to protect the layers of acoustic stack 110 from chemical reactions with substances that may enter through a leak in a package.

The planarization layer 130 may be formed of non-etchable boron-doped silicon glass (NEBSG), for example. The planarization layer 130 is not strictly required for the functioning of BAW resonator 100, but its presence can confer various benefits. For instance, the presence of the planarization layer 130 tends to improve the structural stability of BAW resonator 100, may improve the quality of growth of subsequent layers, and may allow the bottom electrode 120 to be formed without its edges extending beyond the cavity 108, if desired. Further examples of potential benefits of planarization are presented in U.S. Patent Application Publication No. 2013/0106534 (May 2, 2013) to Burak et al., which is hereby incorporated by reference in its entirety.

The bottom and top electrodes 120 and 150 are electrically connected to external circuitry via corresponding contact pads (not shown), which are typically formed of a conductive material, such as gold or gold-tin alloy. Although not shown in FIG. 1B, connections between electrodes and the contact pads extend laterally outward from acoustic stack 110. The connections are generally formed of a suitable conductive material, such as titanium (Ti), tungsten (W), aluminum (Al) and/or gold (Au), for example.

In the depicted embodiment, the piezoelectric layer 140 is formed of LN or LT, as discussed above, which materials are used in place of conventional piezoelectric materials, such as AlN, ASN, ZnO, or PZT, for example. For BAW resonators designed for operating in predominantly low frequency bands, such as bands B13, B17 and B20/B8, the high dielectric constant $\varepsilon_{33}$ of the LN or LT material enable reduction in area of the piezoelectric layer 140, while providing effective coupling coefficients $kt^2$ sufficient for operation at the low frequencies. Thus, the area of the BAW resonator 100 required to obtain the pre-defined electrical impedance at the operating frequency is reduced. Alternative solutions for attempting to reduce resonator area, such as increasing of Sc content in ASN beyond 9 atomic percent, would have drawbacks, such as increased processing time (e.g., increased etch time of Sc-rich ASN), target issues and larger final-resonator areas than with LN or LT piezoelectric material.

When compared to a piezoelectric layer formed of ASN having approximately 9 atomic percent Sc doping, for example, a piezoelectric layer formed of LN or LT enables reduction in area of the BAW resonator 100 of more than about 50 percent (for low band frequency operation), while maintaining approximately the same effective coupling coefficients $kt^2$ that would otherwise be provided by the ASN piezoelectric layer. More particularly, as mentioned above, when the piezoelectric layer 140 is formed of sputtered c-axis LN, its dielectric constant $\varepsilon_{33}$ is about 26 and its intrinsic coupling coefficient $kt^2$ is about 5.9 percent, and when the piezoelectric layer 140 is formed of sputtered c-axis LT, its dielectric constant $\varepsilon_{33}$ is about 42 and its intrinsic coupling coefficient $kt^2$ is about 2.8 percent. In comparison, a piezoelectric layer formed of ASN with about 9 atomic percent Sc doping has a dielectric constant $\varepsilon_{33}$ of only about 10, and although the intrinsic coupling coefficient $kt^2$ is approximately 1.5 and approximately 3 times higher than the intrinsic coupling coefficients $kt^2$ of the LN and LT piezoelectric materials, respectively, the higher dielectric constant and LN and LT combined with approximately 30% and 40%, respectively, lower sound velocity for a longitudinal wave provide adequate performance for the low frequency bands, while significantly reducing the area of the BAW resonator 100. Indeed, when the piezoelectric layer 140 is formed of LN, for example, as opposed to ASN doped with about 9 atomic percent Sc, the area of the BAW resonator 100 is reduced by about 63 percent for operation in band B17, and by about 54 percent for operation in band B20.

FIG. 1C is a cross-sectional view of BAW resonator 100' in accordance with another representative embodiment. In the illustrated embodiments, BAW resonator 100' comprises an FBAR, although it could take the form of another BAW resonator, such as an SMR or DBAR, for example.

Referring to FIG. 1C, BAW resonator 100' is substantially the same as BAW resonator 100 in FIG. 1B, except that each of the bottom electrode 120' and the top electrode 150' is a composite electrode including layers of different conductive materials. That is, The BAW resonator 100' comprises substrate 105 and acoustic stack 110 formed over air cavity 108 in the substrate 105. The acoustic stack 110' comprises a bottom (first) electrode 120', a piezoelectric layer 140 formed over the bottom electrode 120', and top (second) electrode 150' formed over the piezoelectric layer 140. The planarization layer 130 may be formed over substrate 105 adjacent the bottom electrode 120', providing a planar surface together with the bottom electrode 120' over which the piezoelectric layer 140 is applied.

In the depicted embodiment, the bottom electrode 120', being a composite electrode, comprises a bottom conductive layer 120b and a top conductive layer 120t. The top electrode 150' similarly comprises a bottom conductive layer 150b and a top conductive layer 150t. The conductive layers of bottom and top electrodes 120' and 150' are formed of materials that have acoustic impedances that increase relative to their distance from piezoelectric layer 140. For example, the bottom conductive layer 120b and top conductive layer 150t may be formed of a material having relatively high acoustic impedance, such as tungsten (W) or iridium (Ir) (each of which may be referred to as a second conductive layer formed of second material(s) having a second acoustic impedance), while top conductive layer 120t and bottom conductive layer 150b may be formed of a material having relatively low acoustic impedance, such as molybdenum (Mo) or niobium (Nb) (each of which may be referred to as a first conductive layer formed of first material(s) having a first acoustic impedance, less that the second acoustic impedance). Various alternative materials that can be used in bottom and top electrodes 120' and 150' (in addition to or instead of those mentioned above) include, for example, aluminum (Al), platinum (Pt), ruthenium (Ru), or hafnium (Hf). Also, in alternative embodiments, the BAW resonator 100' may include only one composite electrode, without departing from the scope of the present teachings. For example, the acoustic stack 110' may include (composite) bottom electrode 120' (with bottom conductive layer 120b and a top conductive layer 120t) and top electrode 150, or the acoustic stack 110' may include bottom electrode 120 and (composite) top electrode 150' (with bottom conductive layer 150b and a top conductive layer 150t). Examples of an FBAR with composite bottom and/or top electrodes comprising conductive layers having different acoustic impedances are described by U.S. patent application Ser. No. 14/526,259 to Burak et al. (filed Oct. 28, 2014), now published as U.S. Patent Application Publication No. 2015/0280687 (Oct. 1, 2015), which is hereby incorporated by reference in its entirety.

As discussed above, in the depicted embodiment, the piezoelectric layer 140 is formed of LN or LT, which materials are used in place of conventional piezoelectric materials, such as AlN, ASN, ZnO, or PZT, for example. For BAW resonators designed for operating in predominantly low frequency bands, such as bands B13, B17 and B20/B8, the high dielectric constants $\varepsilon_{33}$ of the LN or LT material enable reduction in area of the piezoelectric layer 140, while providing effective coupling coefficients $kt^2$ sufficient for operation at the low frequencies. Thus, the area of the BAW resonator 100' required to obtain the pre-defined electrical impedance at the operating frequency is reduced.

Figure 1D:
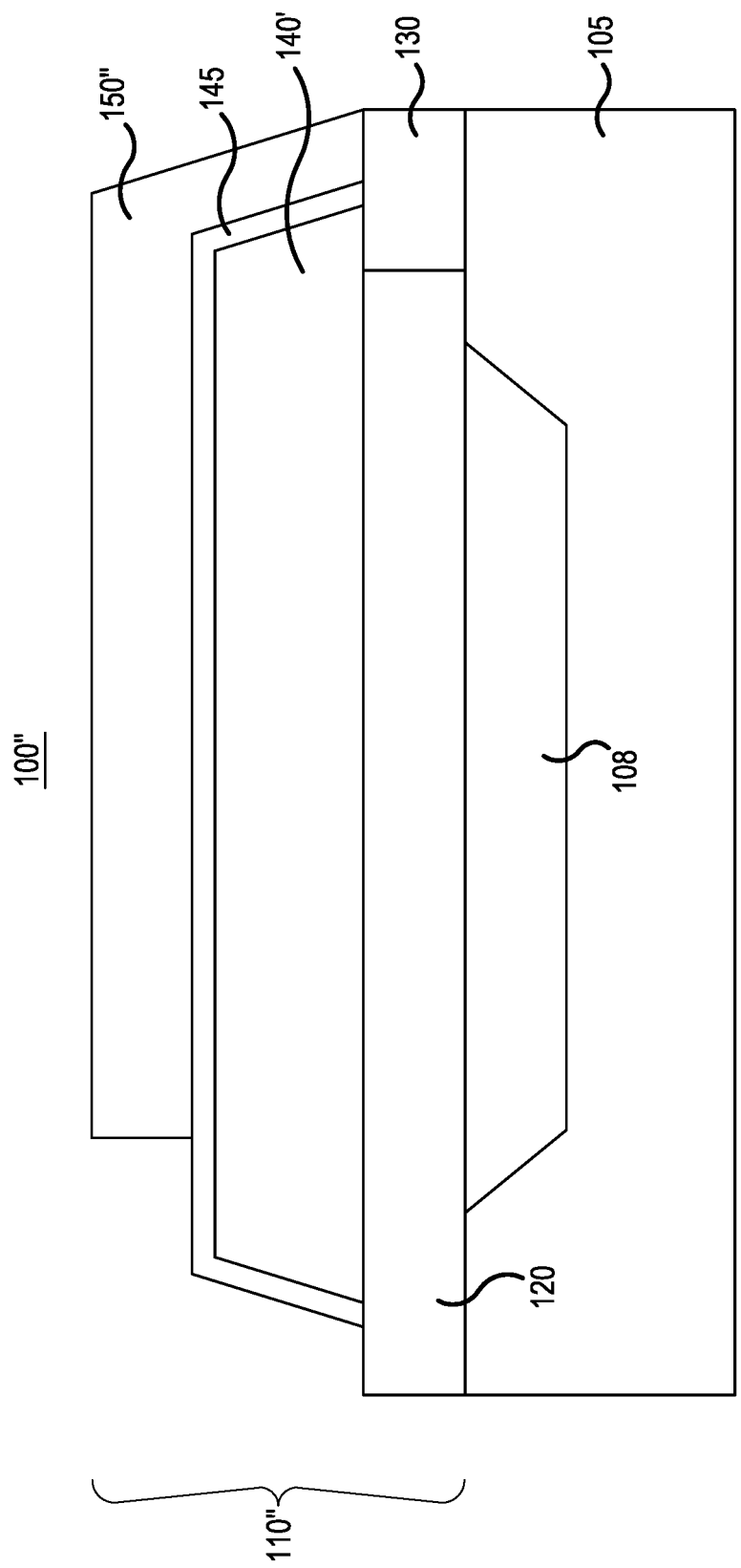
FIG. 1D is a cross-sectional view of a BAW resonator with an encapsulated piezoelectric layer comprising LN or LT, according to a representative embodiment.

FIG. 1D is a cross-sectional view of BAW resonator 100" in accordance with another representative embodiment. In the illustrated embodiments, BAW resonator 100" comprises an FBAR, although it could take the form of another BAW resonator, such as an SMR or DBAR, for example.

Referring to FIG. 1D, BAW resonator 100" is substantially the same as BAW resonator 100 in FIG. 1B, with the addition of the piezoelectric layer being covered by an encapsulant layer 145. In particular, the encapsulant layer 145 may be formed over side and top surfaces of piezoelectric layer 140', such that the encapsulant layer 145, together with the bottom electrode 120, protects the LN or LT material of the piezoelectric layer 140' from release solvents previously applied to sacrificial material (discussed above) from within the cavity 108 in the substrate 105.

Referring to FIG. 1D, the BAW resonator 100" comprises a substrate 105 and an acoustic stack 110", in a simplified representation, formed over the air cavity 108. As mentioned above, the air cavity 108 may be formed by etching substrate 105 and depositing a sacrificial material therein prior to formation of acoustic stack 110", and then removing the sacrificial material after formation of acoustic stack 110 by a wet release process using hydrofluoric acid (HF), for example (thus the need for the encapsulant layer 145). That is, the encapsulant layer 145 and the bottom electrode 120 protect the LN material or the LT material from interacting with the HF, for example.

The acoustic stack 110" comprises the bottom electrode 120, a piezoelectric layer 140' formed over the bottom electrode 120, the encapsulant layer 145 formed on side and top surfaces of the piezoelectric layer 140', and a top electrode 150" formed over the encapsulant layer 145. As shown in the depicted embodiment, the piezoelectric layer 140' may be formed with sloped side-walls to accommodate application of the encapsulant layer 145 and smooth void-free top electrode 150". More particularly, the bottom electrode 120 is disposed over the substrate 105 over the air cavity 108, a planarization layer 130 is disposed adjacent to the bottom electrode 120 over the substrate 105, the piezoelectric layer 140' is disposed over the bottom electrode 120 and the planarization layer 130, the encapsulant layer 145 is disposed on side and top surfaces of the piezoelectric layer 140', and the top electrode 150" disposed over the encapsulant layer 145 (also over the side and top surfaces of the piezoelectric layer 140). Accordingly, a barrier is provided around the piezoelectric layer 140' by the encapsulant layer 145 on the top and side surfaces of the piezoelectric layer 140' and the bottom electrode 120 (and possibly the planarization layer 130, depending on the relative length of the bottom electrode 120) on the bottom surface of the piezoelectric layer 140', thereby protecting the LN or LT material from the release solvents applied to the release the sacrificial material (e.g., in the cavity 108).

The encapsulant layer 145 may be formed of various types of dielectric materials, such as silicon carbide (SiC) or non-etchable boron-doped silicon glass (NEBSG), resistant to release solvents, such as HF and the like. The piezoelectric layer 140' is formed of LN or LT, as discussed above, which materials are used in place of conventional piezoelectric materials, such as ASN, AlN, ZnO, or PZT, for example. For BAW resonators designed for operating in predominantly low frequency bands, such as bands B13, B17 and B20/B8, the high dielectric constants $\varepsilon_{33}$ of the LN or LT material enable reduction in area of the piezoelectric layer 140', while providing effective coupling coefficients $kt^2$ sufficient for operation at the low frequencies. Thus, the area of the BAW resonator 100'' required to obtain the pre-defined electrical impedance at the operating frequency is reduced, while performance characteristics remain substantially the same. The LN or LT piezoelectric layer 140' being covered by the thin encapsulant layer 145 as shown in FIG. 1D enables reduction in area of the BAW resonator 100'' by about the same amounts discussed above with regard to the LN or LT piezoelectric layer 140 shown in FIG. 1B, e.g., when compared to a piezoelectric layer formed of ASN having approximately 9 atomic percent Sc doping, for example. In other words, the presence of that encapsulant layer 145 does not appreciably affect performance of the piezoelectric layer 140' when compared to a BAW resonator, such as the BAW resonator 100, without an encapsulant layer.

Notably, each of the BAW resonators 100, 100' and 100'' discussed above is an FBAR (with the cavity 108 formed in the substrate 105 as the acoustic reflector). It is understood that in alternative embodiments, each of the BAW resonators 100, 100' and 100'' may be formed as a SMR (with an acoustic mirror formed over the substrate 105 as the acoustic reflector instead of the cavity 108). However, with regard to the BAW resonator 100'' in particular, there would be no need for the encapsulant layer 145 if the cavity 108 were replaced by a DBR, since there would be no sacrificial material (initially provided in the cavity 108), and thus no subsequent application of a release solvent during the fabrication process from which to protect the piezoelectric layer 140' (unless, of course, the BAW resonator includes other features, such as an air-bridge or an air-wing, requiring application and subsequent release of sacrificial material, as discussed below with reference to FIGS. 3A and 3B, for example).

Figure 2A:
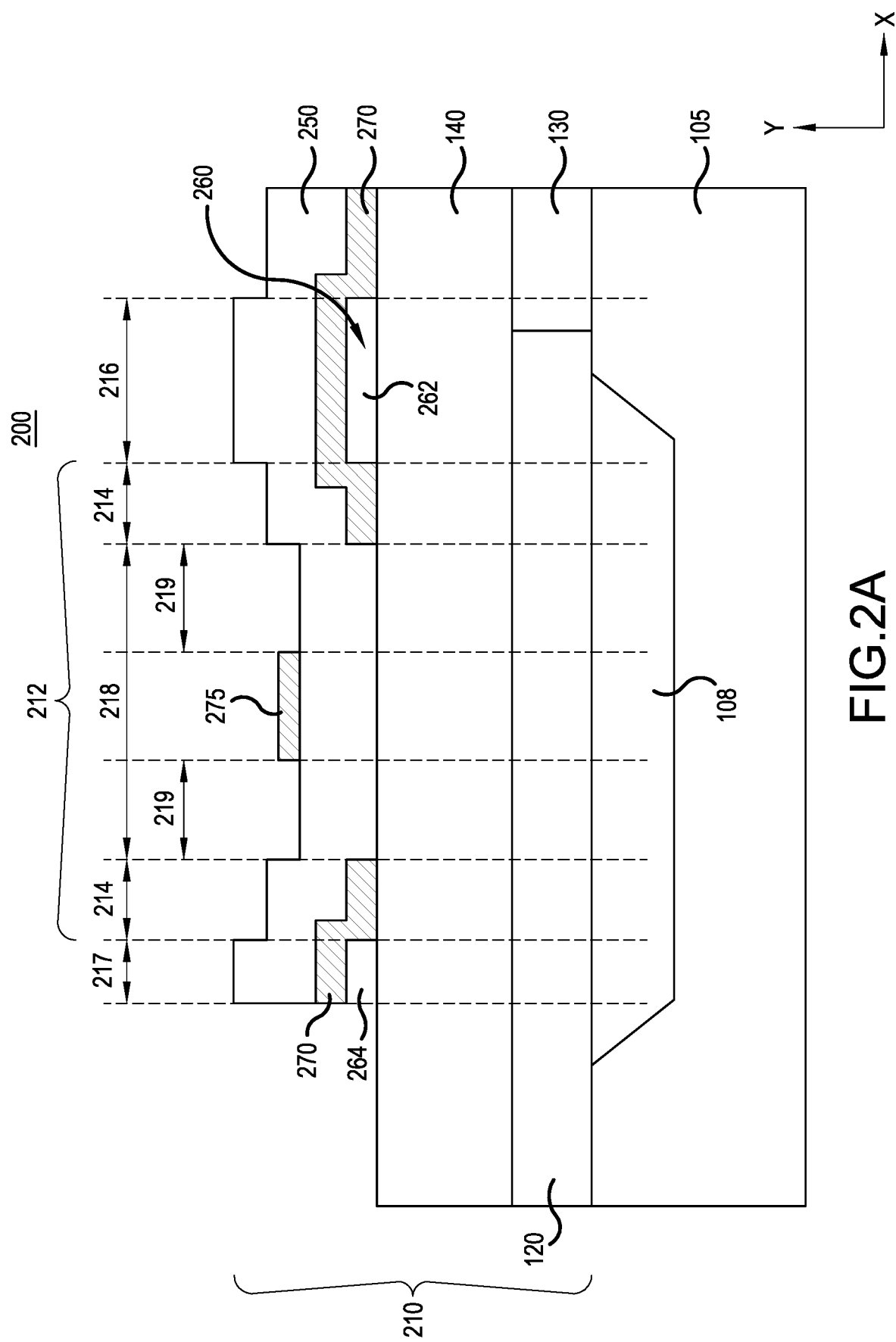
FIG. 2A is a cross-sectional view of a BAW resonator with lateral performance enhancement features and a piezoelectric layer comprising LN or LT, according to a representative embodiment.
Figure 3A:
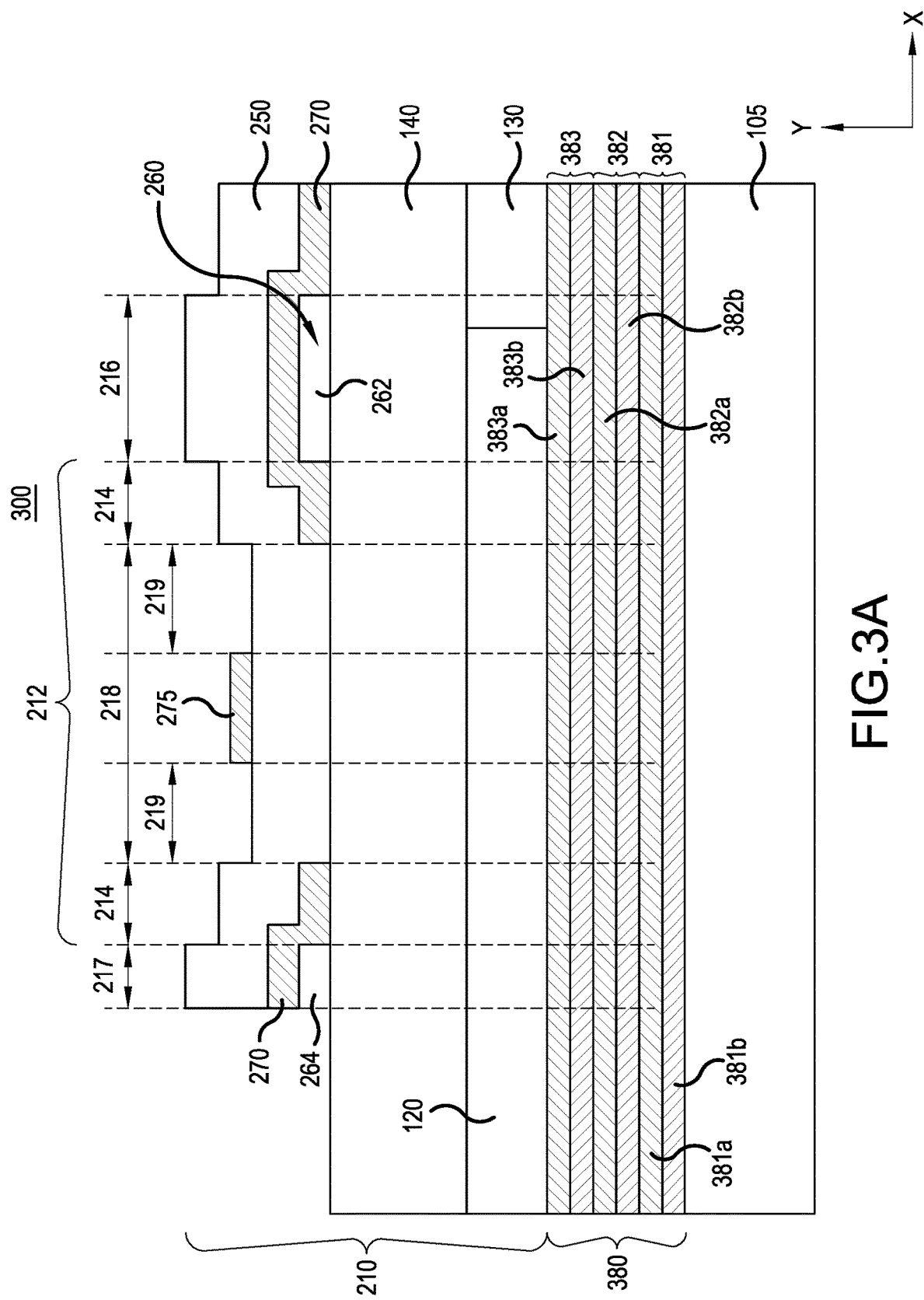
FIG. 3A is a cross-sectional view of a BAW resonator with lateral performance enhancement features, an acoustic mirror and a piezoelectric layer comprising LN or LT, according to a representative embodiment.
Figure 3B:
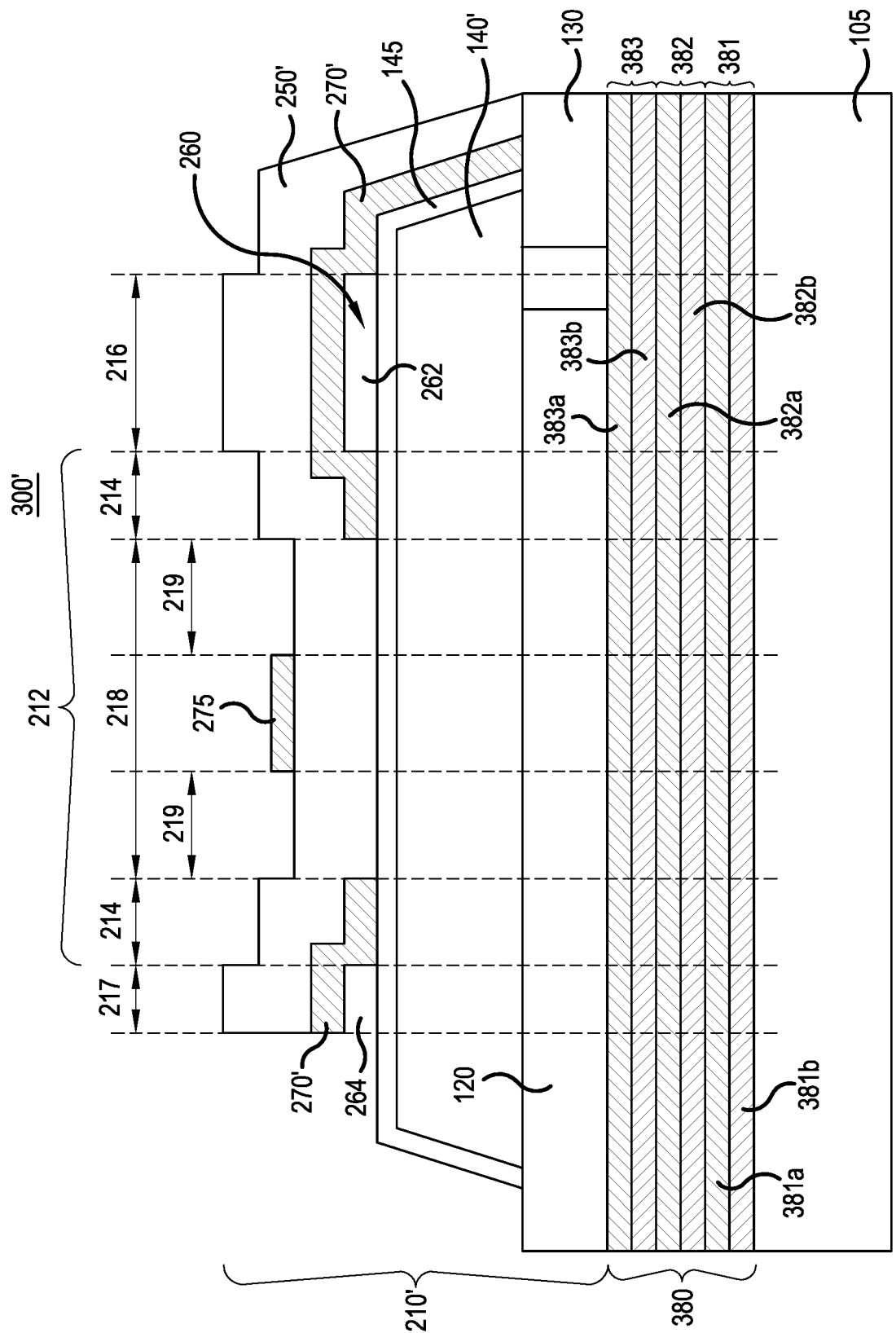
FIG. 3B is a cross-sectional view of a BAW resonator with lateral performance enhancement features, an acoustic mirror and an encapsulated piezoelectric layer comprising LN or LT, according to a representative embodiment.

FIG. 2A is a cross-sectional view of a BAW resonator with energy-confinement features and a piezoelectric layer comprising LN or LT, and FIG. 2B is a cross-sectional view of a BAW resonator with lateral performance enhancement features and an encapsulated piezoelectric layer comprising LN or LT, according to representative embodiments, respectively, in which the BAW resonator is an FBAR (with a cavity formed in the substrate as the acoustic reflector). FIG. 3A is a cross-sectional view of a BAW resonator with energy-confinement features and a piezoelectric layer comprising LN or LT, and FIG. 3B is a cross-sectional view of a BAW resonator with lateral performance enhancement features and an encapsulated piezoelectric layer comprising LN or LT, according to representative embodiments, respectively, in which the BAW resonator is an SMR (with a DBR formed over the substrate as the acoustic reflector). That is, FIGS. 3A and 3B provide cross-sectional diagrams of SMRs similar to the FBARs depicted in FIGS. 2A and 2B, respectively, except with an acoustic mirror (e.g., DBR 380) formed over the substrate in place of the cavity as the accosting reflecting feature.

It is understood that the same general configurations may be included in BAW resonators having frames and/or air-rings in various locations, without departing from the scope of the present teachings. Notably, the BAW resonators shown in FIGS. 2A and 2B, as well as in FIGS. 3A and 3B, may have apodized pentagon shapes, as shown in FIG. 1A, although other shapes may be incorporated, such as quadrilaterals or hexagons, for example.

BAW resonators with at least one lateral performance enhancement feature (e.g., one or more energy-confinement features on or in the bottom and/or top electrodes 120 and 150, 150') may further enhance performance. Examples of such lateral performance enhancement features include outer frames, inner frames, and air-rings (comprising air-bridges and/or air-wings). Generally, an overlap among the top electrode, the piezoelectric layer and the bottom electrode over an acoustic reflecting feature (e.g., an air cavity or an acoustic mirror, such as a distributed Bragg reflect (DBR)) defines a main membrane region. One or more frames may be formed on the top electrode, on the piezoelectric layer (between the piezoelectric layer and the top electrode), on the bottom electrode (between the bottom electrode and the piezoelectric layer), and/or below the bottom electrode, defining an active region within the main membrane region. That is, an inner edge of the frame extending furthest into the main membrane region defines an outer boundary of the active region. In addition, one or more air-rings may be formed outside an outer boundary of the main membrane region. The air-ring(s) may be formed between the piezoelectric layer and the top electrode and/or between the bottom electrode and the piezoelectric layer, for example. When an air-ring is formed between the piezoelectric layer and the top electrode, it comprises an air-bridge on the connection side of the top electrode and an air-wing along the remaining outside perimeter.

A frame may be formed by adding a layer of material, usually an electrically conducting material (although dielectric material is possible as well), to the top electrode and/or the bottom electrode. The frame may be an add-on frame. An add-on frame may be formed by depositing the material above or below of a layer forming either the top or bottom electrode along a perimeter of the active region. A region of the acoustic resonator above and below the frame (and bordered by an air-ring) may be collectively referred to as a frame region.

The frame generally suppresses electrically excited piston mode in the frame region, and it reflects and otherwise resonantly suppresses propagating eigenmodes in lateral directions, with both effects simultaneously improving operation of the acoustic resonator. This is because the frame's presence generally produces at least one of a cutoff frequency mismatch and an acoustic impedance mismatch between the frame region and other portions of the active region. A frame that lowers the cutoff frequency in the frame region as compared to the active region may be referred to as a Low Velocity Frame (LVF), while a frame that increases the cutoff frequency in the frame region as compared to the main active region may be referred to as a High Velocity Frame (HVF). The reasoning behind this nomenclature is that for composite frames (for which thicknesses of the frame and active regions are substantially the same), an increase or decrease of the cutoff frequency is substantially equivalent to an increase or decrease an effective sound velocity of the acoustic stack forming the frame, respectively.

An add-on frame with lower effective sound velocity than the corresponding effective sound velocity of the active region (i.e., an LVF) generally increases parallel resistance Rp and Q-factor of the acoustic resonator above the cutoff frequency of the active region. Conversely, an add-on frame with a higher effective sound velocity than the corresponding effective sound velocity of the active region (i.e., an HVF) generally decreases series resistance Rs and increases Q-factor of the acoustic resonator below the cutoff frequency of the main active region. A typical low velocity frame, for example, effectively provides a region with significantly lower cutoff frequency than the active region and therefore suppresses the amplitude of the electrically excited piston mode towards the edge of the top electrode in the frame region. Furthermore, it provides two interfaces (impedance miss-match planes), which increase reflection of propagating eigenmodes. These propagating eigenmodes are mechanically excited at active/frame interface, and both mechanically and electrically excited at the top electrode edge. Where the width of the frame is properly designed for a given eigenmode, it results in resonantly enhanced suppression of that particular eigenmode. In addition, a sufficiently wide low velocity frame provides a region for smooth decay of the evanescent and complex modes, which are excited by similar mechanisms as the propagating eigenmodes. The combination of the above effects yields better energy confinement and higher Q-factor at a parallel resonance frequency Fp.

Various additional examples of frames, as well as related materials and operating characteristics, are described in U.S. Patent App. Pub. No. 2014/0118091 to Burak et al. (May 1, 2014), U.S. Patent App. Pub. No. 2014/0118088 to Burak et al. (May 1, 2014), and U.S. Patent App. Pub. No. 2015/0280687 to Burak et al. (Oct. 1, 2015), which are hereby incorporated by reference in their entireties. As explained in those applications, frames can be placed in various alternative locations and configurations relative to other portions of an acoustic resonator, such as the electrodes and piezoelectric layer of an acoustic stack. Additionally, their dimensions, materials, relative positioning, and so on, can be adjusted to achieve specific design objectives, such as a target resonance frequency, series resistance Rs, parallel resistance Rp, or coupling coefficient $kt^2$.

Referring to FIG. 2A, BAW resonator 200 (e.g., an FBAR) comprises substrate 105 defining air cavity 108, bottom (first) electrode 120 disposed over the substrate 105 over the air cavity 108, planarization layer 130 disposed adjacent to bottom electrode 120 over the substrate 105, piezoelectric layer 140 disposed over the bottom electrode 120 and the planarization layer 130, and a top (second) electrode 250 disposed over the piezoelectric layer 140. Collectively, bottom electrode 120, the piezoelectric layer 140, and the top electrode 250 constitute an acoustic stack 210 of BAW resonator 200. Also, an overlap among the bottom electrode 120, the piezoelectric layer 140 and the top electrode 250 over the air cavity 108 defines a main membrane region 212 of the BAW resonator 200. Dotted vertical lines indicate the boundary of the main membrane region 212. Although not shown, a passivation layer may be present on top electrode 250 (in each embodiment) with thickness sufficient to insulate all layers of the acoustic stack from the environment, including protection from moisture, corrosives, contaminants, debris and the like.

Each of the bottom electrode 120 and the top electrode 250 is shown comprised of one material (e.g., Mo or W). However, one or both of the bottom electrode 120 and the top electrode 250 may be a composite electrode, such as bottom electrode 120' and/or the top electrode 150' shown in FIG. 1C (as well as the bottom and top electrodes shown in FIGS. 2B, 3A and 3B), including multiple layers of different conductive materials. That is, the bottom electrode 120 may comprise bottom and top conductive layers (not shown), and/or top electrode 250 may comprise bottom and top conductive layers (not shown), as discussed above, without departing from the scope of the present teachings. For example, conductive layers formed adjacent the piezoelectric layer 140 (i.e., the inner conductive layers) may be formed of a material having relatively high acoustic impedance, such as W or Ir, while conductive layers not formed adjacent the piezoelectric layer 140 (i.e., the outer conductive layers) may be formed of a material having relatively low acoustic impedance, such as Mo or Nb. As mentioned above, various alternative materials that can be used first or second layers in a composite electrode include, e.g., Al, Pt, Ru, or Hf, for example.

The BAW resonator 200 further comprises a number of lateral performance enhancement features, including illustrative top air-ring 260, top outer frame 270 and top inner frame 275. The air-ring 260 is formed between the piezoelectric layer 140 and the top electrode 250, and defines an outside boundary of the main membrane region 212. More particularly, in the depicted embodiment, an upper boundary of the air-ring 260 is provided by the outer frame 270, which is an add-on frame formed on the piezoelectric layer 140. Notably, the shapes of the air-ring 260 and the outer frame 270 (discussed further below) propagate through the top electrode 250, giving it an irregular shape. The inner frame 275 is formed on a top surface of the top electrode 250, and provides mass loading with respect to a gap region 219 between outer frame 270 and the inner frame 275. The relative under-loading of the gap region 219 shifts the resonance frequency up and facilitates formation of the HVF in that region, as mentioned above. Combined, the outer frame 270, the inner frame 275 and air-ring 260 facilitate wide-band performance improvement of the BAW resonator 200.

The air-ring 260 extends along all or a portion of the perimeter of the BAW resonator 200. In the cross-sectional view, the air-ring 260 includes an air-bridge 262 and an air-wing 264. The width of the air-bridge 262 defines an air-bridge extension region 216 adjacent the main membrane region 212. Likewise, the width of the air-wing 264 defines an air-wing region 217, also adjacent the main membrane region 212. Dotted vertical lines indicate the boundaries of air-bridge extension region 216 and the air-wing region 217, respectively. The air-bridge 262 and the air-wing 264 have respective inner edges that substantially define an outer boundary of the main membrane region 212.

The air-bridge 262 is disposed on the connection side (e.g., connection side 101 in FIG. 1A) of the top electrode 250, and therefore is enclosed by the top electrode 250. The air-wing 264 is disposed along the remaining sides of the BAW resonator 200 (i.e., along the remaining perimeter), and therefore is open on one side. Although the air-bridge 262 and the air-wing 264 are shown with rectangular cross-sections, these structures (and other air-bridges or air-wings described herein) may have other shapes, such as trapezoidal or partially trapezoidal cross-sectional shapes, without departing from the scope of the present teachings. Examples of configurations, dimensions, alternative shapes, and the like with regard to air-bridges and/or air-wings are described and illustrated in U.S. Pat. No. 9,136,818 to Burak et al. (Sep. 15, 2015), U.S. Pat. No. 9,203,374 to Burak et al. (Dec. 1, 2015), U.S. Pat. No. 8,248,185 Choy et al. (Aug. 21, 2012), and U.S. Pat. No. 8,902,023 to Choy et al. (Dec. 2, 2014), the disclosures of which are hereby incorporated by reference in their entireties.

In certain embodiments, the air-ring 260 (and other air-rings described in connection with representative embodiments below) extends over the cavity 108 by an overlap (also referred to as decoupling region), determining separation of the outer edge of the main membrane region 212 from the substrate 105 edge. Also, the air-bridge 262 of the air-ring 260 extends over the piezoelectric layer 140 by an air-bridge extension (also referred to as the air-bridge extension region 216, mentioned above). The decoupling region has a width (x-dimension) of approximately 0.0 µm (i.e., no overlap with the cavity 108) to approximately 10.0 µm, and the air-bridge extension region 216 has a width of approximately 0.0 µm (i.e., no air-bridge) to approximately 50.0 µm, for example.

Generally, optimum widths of the decoupling region and the air-bridge extension region 216 of the air-bridge 262 (and other air-bridges described in connection with representative embodiments below) depend on the reflection and suppression of the eigen-modes at the boundary of the main membrane region 212 and the decoupling region (i.e., the cavity overlap). Due to substantially increased cut-off frequency of the combined first electrode 215 and piezoelectric layer 140 stack in the decoupling region, only complex evanescent modes (for the thickness-extensional motion) and propagating flexural and dilatational modes can exist at the operating frequency of the BAW resonator 200. Also, due to substantially increased cut-off frequency of the top electrode 250 in the air-bridge extension region 216, only complex evanescent modes (for the thickness-extensional motion) and propagating flexural and dilatational modes can exist at the operating frequency of the BAW resonator 200. The complex evanescent modes in the decoupling region and the air-bridge extension region 216 are characterized by a characteristic decay length and by a specific propagation constant. Thus the air-bridge 262, for example, needs to be wide enough to ensure suitable decay of complex evanescent waves excited at the boundary of the main membrane region 212 and the decoupling region and the air-bridge extension region 216.

Generally, wide decoupling region and air-bridge extension region 216 allow for minimizing of tunneling of energy into the substrate 105, where propagating modes exist at the frequency of operation. On the other hand, when the air-bridge extension region 216 of the air-bridge 262 is too wide, reliability issues can arise and it can also limit similar acoustic resonators (not shown) from being placed in proximity (thus unnecessarily increasing the total area of a chip). In practical situations the propagating components of the complex evanescent and propagating flexural and dilatational waves in the decoupling region and the air-bridge extension region 216 may be used to find the optimum widths, respectively. In general, for any single propagating or complex mode, when the width of the decoupling region or the air-bridge extension region 216 of the air-bridge 262 is about equal to an odd multiple of the quarter-wavelength of a given eigen-mode, the reflectivity of that eigen-mode may be further increased, which may be manifested by parallel resistance Rp and Q-factor attaining maximum values. However, since it may be difficult to satisfy such conditions simultaneously for all the complex and propagating eigen-modes supported by both regions, optimization of air-bridge 262 geometry for high parallel resistance Rp and Q-factor values is done numerically and experimentally.

The air-bridge 262 (and other bridges described in connection with representative embodiments below) has a height (y-dimension in the coordinate system of FIG. 2A) of approximately 300 Å to approximately 5000 Å. Notably, the lower limit of the height is determined by the limits of the process of releasing sacrificial material in the forming of the air-bridge 262 (and other bridges described in connection with representative embodiments below), and the upper limit of the height is determined by the quality of layers deposited over the air-bridge 262 (and other bridges described in connection with representative embodiments) and by the quality of subsequent processing of possibly non-planar structures.

As mentioned above, the BAW resonator 200 further comprises the outer frame 270 disposed on a top surface of the piezoelectric layer 140 (although the outer frame 270 does not physically contact those portions of the piezoelectric layer 140 where the air-ring 260 is arranged). In the depicted embodiment, the outer frame 270 is an add-on frame, which is typically easier to fabricate than a composite frame (integrally formed within an electrode), for example. The outer frame 270 has an inner edge that defines a boundary of an active region 218 formed within the main membrane region 212. A frame region 214 is formed between the inner edge of the outer frame 270 (which substantially coincides with the outer boundary of the active region 218) and an inner edge of the air-ring 260 (which substantially coincides with the outer boundary of the main membrane region 212). Thus, the main membrane region 212 effectively consists of the active region 218 and the frame region 214.

Generally, the outer frame 270 minimizes scattering of electrically excited piston mode at edges of the top electrode 250, and improves confinement of mechanical motion to the active region 218. Thus, the outer frame 270 is able to suppress excitation of propagating modes. Various enhancements provided by frames (such as outer frame 270) and air-rings (such as air-ring 260) to acoustic resonator performance are described, for example, by U.S. Patent App. Pub. No. 2014/0176261 to Burak et al. (Jun. 26, 2014), which is hereby incorporated by reference in its entirety.

The outer frame 270 may be formed of one or more conductive or dielectric materials, such as copper (Cu), molybdenum (Mo), aluminum (Al), tungsten (W), iridium (Ir), borosilicate glass (BSG), tetraethyl orthosilicate (TEOS), carbon-doped silicon oxide (CDO), silicon carbide (SiC), silicon nitride (SiN), silicon dioxide ($SiO_2$), aluminum oxide ($Al_2O_3$), aluminum nitride (AlN), zinc oxide (ZnO), lead zirconium titanate (PZT), diamond or diamond-like carbon (DLC), for example.

The air-bridge 262 is typically designed to be wide enough to cross over the bottom electrode 120 edge (as shown in FIG. 2A) and to ensure suitable decay of complex evanescent waves excited at the boundary of main membrane region 212 and the air-bridge extension region 216. The air-wing 264 is typically designed to have a width corresponding to resonant enhancement of parallel resistance Rp resulting from resonant suppression of propagating modes supported by main membrane region 212 and the outside regions. As mentioned above, if the air-bridge 262 or the air-wing 264 is too wide, reliability issues can arise and can also limit the placement of similar FBARs (not shown) from being placed in proximity (thus unnecessarily increasing the total area of a chip). In addition, increased width of the air-wing 264 generally results in decrease in the effective coupling coefficient $kt^2$ due to increased through-air capacitive coupling of the top electrode 250 with the acoustic stack 210 comprising the piezoelectric layer 140 and the bottom electrode 120, which in turn results in a degradation of insertion loss ($S_{21}$) of a filter comprising multiple FBARs, for example. Thus, in general, optimum widths of the air-bridge 262 and air-wing 264 may be determined experimentally and numerically to meet the electrical performance and reliability requirements of the product comprising the BAW resonator 200.

As mentioned above, the air-ring 260, comprising the air-bridge 262 and the air-wing 264, typically defines a perimeter along the main membrane region 212 of the BAW resonator 200. The main membrane region 212 thus includes the portions of the BAW resonator 200 disposed over the air cavity 108 and bounded by the perimeter provided by the air-ring 260. Accordingly, the main membrane region 212 is bordered around its perimeter by an acoustic impedance discontinuity created at least in part by air-bridge 262 and air-wing 264, and above and below (the air cavity 108) by an acoustic impedance discontinuity due to the presence of air. Thus, a resonant cavity is beneficially provided in the main membrane region 212 of the BAW resonator 200.

In the depicted embodiment, air-bridge 262 and air-wing 264 are unfilled, i.e., they contain air. In this case, the air-bridge 262 and air-wing 264 are initially filled with sacrificial material (discussed above) during fabrication of the BAW resonator 200, where the sacrificial material is subsequently released using a dry wet release process, as described above with regard to releasing the sacrificial material from the cavity 108. Since the piezoelectric layer 140 is formed of is formed of LN or LT, it is susceptible to being etched away during a wet release process (i.e., since there is no encapsulant layer on the piezoelectric layer 140). In other embodiments, these structures may be "filled," e.g., with a dielectric or metal material to provide the desired acoustic impedance discontinuity, in which case the dry release process would be performed only to release the sacrificial material in the cavity 108.

It is noted that the described structures do not necessarily have to extend along all edges of BAW resonator 200 (which is also the case for the acoustic resonators depicted in FIGS. 2B, 3A and 3B). For example, they may be provided on only a subset of a five-sided acoustic resonator (such as BAW resonator 100 shown in FIG. 1A).

Acoustic impedance mismatches provided by air-bridge 262 and air-wing 264 cause reflection and suppression of acoustic waves at the boundary that may otherwise propagate out of the main membrane region 212 resulting in energy loss. Accordingly, the air-bridge 262 and the air-wing 264 may serve to suppress excitation on unwanted propagating modes in the main membrane region 212 and outside regions, resulting in better energy confinement within the main membrane region 212 and reduction of energy losses to acoustic radiation in the BAW resonator 200. Reducing such losses increases the Q-factor of BAW resonator 200. In filter applications of BAW resonator 200, for example, as a result of the reduced energy loss, the insertion loss ($S_{21}$) may be beneficially improved.

Referring to FIG. 2B, BAW resonator 200' is similar to BAW resonator 200 shown in FIG. 2A, with the addition of the piezoelectric layer being covered by encapsulant layer 145. In particular, the encapsulant layer 145 may be formed on side and top surfaces of piezoelectric layer 140', such that the encapsulant layer 145 protects the LN or LT material of the piezoelectric layer 140' from release solvents previously applied during fabrication to release sacrificial material (discussed above) from within the cavity 108, as well as from with the air-bridge 262 and the air-wing 264. That is, as discussed above, the air-ring 260 is filled with sacrificial material (e.g., $SiO_2$, PSG) during the fabrication process to provide a surface for subsequent application of the outer frame 270', the top electrode 250' and the inner frame 275. After completion of the acoustic stack 210', the sacrificial material in the cavity 108 and the air-ring 260 (e.g., including the air-bridge 262 and the air-wing 264) may be released using a liquid release solvent, such as HF, since the inclusion of the encapsulant layer 145, along with the bottom electrode 120, surrounds and protects the piezoelectric layer 140' from the release solvent.

Thus, the BAW resonator 200' comprises substrate 105 and acoustic stack 210', in a simplified representation, formed over the air cavity 108. The acoustic stack 210' comprises the bottom electrode 120 formed over the substrate 105 over the cavity 108, the piezoelectric layer 140' formed over the bottom electrode 120 and the planarization layer 130, the encapsulant layer 145 formed on side and top surfaces of the piezoelectric layer 140', and a top electrode 150' formed over the encapsulant layer 145. As shown in the depicted embodiment, the piezoelectric layer 140' may be formed with sloped side-walls to accommodate application of the encapsulant layer 145, as discussed above with reference to FIG. 1D. Accordingly, a barrier is provided around the piezoelectric layer 140' by the encapsulant layer 145 on the top and side surfaces of the piezoelectric layer 140' and on the bottom electrode 120 (and possibly the planarization layer 130, depending on the relative length of the bottom electrode 120) on the bottom surface of the piezoelectric layer 140', thereby protecting the LT or LN material from the release solvents applied to the release the sacrificial material (e.g., in the cavity 108, the air-bridge 262 and the air-wing 264). In the depicted embodiment, the outer frame 270' is formed on the top and side surfaces of the encapsulant layer 145, and the inner frame 275 is formed on the top surface of the top electrode 250'. The outer frame 270' also provides structure forming the air-ring 260 (e.g., through application of the outer frame 270' over sacrificial material corresponding to the air-bridge 262 and the air-wing 264, and subsequent release of the sacrificial material).

Referring to FIG. 3A, BAW resonator 300 is substantially the same as BAW resonator 200 shown in FIG. 2A, except that the acoustic reflector is provided by an acoustic mirror, such as an acoustic mirror (e.g., DBR) 380, instead of cavity 108, in which case the BAW resonator 300 is an SMR as opposed to an FBAR. Thus, the BAW resonator 300 comprises substrate 105, acoustic mirror 380 and acoustic stack 210, in a simplified representation, formed over the acoustic mirror 380. The acoustic stack 210 includes bottom electrode 120 disposed over the acoustic mirror 380, planarization layer 130 disposed adjacent to the bottom electrode 120, acoustic mirror 380, piezoelectric layer 140 disposed over the bottom electrode 120 and the planarization layer 130, and top electrode 250 disposed over the piezoelectric layer 140. Collectively, bottom electrode 120, the piezoelectric layer 140, and the top electrode 250 constitute the acoustic stack 210 of BAW resonator 300. Also, an overlap among the bottom electrode 120, the piezoelectric layer 140 and the top electrode 250 over the acoustic mirror 380 defines main membrane region 212 of the BAW resonator 300. Dotted vertical lines indicate the boundary of the main membrane region 212. Although not shown, a passivation layer may be present on top electrode 250 (in each embodiment) with thickness sufficient to insulate all layers of the acoustic stack from the environment, including protection from moisture, corrosives, contaminants, debris and the like.

The acoustic mirror 380 includes multiple acoustic reflector layer pairs, indicated by representative first acoustic reflector layer pair 381, second acoustic reflector layer pair 382, and third acoustic reflector layer pair 383, sequentially stacked on the substrate 105. Each of the first through third acoustic reflector layer pairs 381-383 may include two conductive layers, for example, where a second conductive layer disposed over a first conductive layer of the pair has a second acoustic impedance greater than a first acoustic impedance of the first conductive layer. More particularly, the first acoustic reflector layer pair 381 includes first low acoustic impedance layer 381a formed of low acoustic impedance material stacked on first high acoustic impedance layer 381b formed of high acoustic impedance material. The second acoustic reflector layer pair 382 includes second low acoustic impedance layer 382a formed of low acoustic impedance material stacked on second high acoustic impedance layer 382b formed of high acoustic impedance material. The third acoustic reflector layer pair 383 includes third low acoustic impedance layer 383a formed of low acoustic impedance material stacked on third high acoustic impedance layer 383b formed of high acoustic impedance material.

Each of the first, second and third low acoustic impedance layers 381a, 382a and 383a may be formed of various low acoustic impedance materials, such as boron silicate glass (BSG), tetra-ethyl-ortho-silicate (TEOS), silicon oxide ($SiO_x$) or silicon nitride ($SiN_x$) (where x is an integer), carbon-doped silicon oxide (CDO), chemical vapor deposition silicon carbide (CVD SiC), plasma enhanced CVD SiC (PECVD SiC), titanium (Ti) or aluminum. Each of the first, second and third high acoustic impedance layers 381b, 382b and 383b may be formed of various high acoustic impedance materials, such as tungsten (W), molybdenum (Mo), niobium molybdenum (NbMo), iridium (Ir), hafnium oxide ($HfO_2$), aluminum oxide ($Al_2O_3$), diamond or diamond-like carbon (DLC). Various illustrative fabrication techniques of acoustic mirrors are described by in U.S. Pat. No. 7,358,831 (Apr. 15, 2008), to Larson III, et al., which is hereby incorporated by reference in its entirety.

The BAW resonator 300 further comprises a number of lateral performance enhancement features, including illustrative air-ring 260, outer frame 270 and top inner frame 275, as discussed above with reference to FIG. 2A. The air-ring 260 is formed between the piezoelectric layer 140 and the top electrode 250, and defines an outside boundary of the main membrane region 212. More particularly, in the depicted embodiment, an upper boundary of the air-ring 260 is provided by the outer frame 270, which is an add-on frame formed on the piezoelectric layer 140. The inner frame 275 is formed on a top surface of the top electrode 250, and provides mass loading.

The air-ring 260 extends along all or a portion of the perimeter of the BAW resonator 200. In the cross-sectional view, the air-ring 260 includes an air-bridge 262 and an air-wing 264. The width of the air-bridge 262 defines an air-bridge extension region 216 adjacent the main membrane region 212. Likewise, the width of the air-wing 264 defines an air-wing region 217, also adjacent the main membrane region 212. Dotted vertical lines indicate the boundaries of air-bridge extension region 216 and the air-wing region 217, respectively. The air-bridge 262 and the air-wing 264 have respective inner edges that substantially define an outer boundary of the main membrane region 212.

As mentioned above, the BAW resonator 200 further comprises the outer frame 270 disposed on a top surface of the piezoelectric layer 140 (although the outer frame 270 does not physically contact those portions of the piezoelectric layer 140 where the air-ring 260 is arranged). In the depicted embodiment, the outer frame 270 is an add-on frame, which is typically easier to fabricate than a composite frame (integrally formed within an electrode), for example. The outer frame 270 has an inner edge that defines a boundary of an active region 218 formed within the main membrane region 212. A frame region 214 is formed between the inner edge of the outer frame 270 (which substantially coincides with the outer boundary of the active region 218) and an inner edge of the air-ring 260 (which substantially coincides with the outer boundary of the main membrane region 212). Thus, the main membrane region 212 effectively consists of the active region 218 and the frame region 214.

As discussed above, the air-bridge 262 is typically designed to be wide enough to cross over the bottom electrode 120 edge and to ensure suitable decay of complex evanescent waves excited at the boundary of main membrane region 212 and the air-bridge extension region 216. The air-wing 264 is typically designed to have a width corresponding to resonant enhancement of parallel resistance Rp resulting from resonant suppression of propagating modes supported by main membrane region 212 and the outside regions. If the air-bridge 262 or the air-wing 264 is too wide, reliability issues can arise and can also limit the placement of similar SMRs (not shown) from being placed in proximity (thus unnecessarily increasing the total area of a chip). In addition, increased width of the air-wing 264 generally results in decrease in the effective coupling coefficient $kt^2$ due to increased through-air capacitive coupling of the top electrode 250 with the acoustic stack 210 comprising the piezoelectric layer 140 and the bottom electrode 120, which in turn results in a degradation of insertion loss ($S_{21}$) of a filter comprising multiple SMRs, for example. Thus, in general, optimum widths of the air-bridge 262 and air-wing 264 may be determined experimentally and numerically to meet the electrical performance and reliability requirements of the product comprising the BAW resonator 300.

In the depicted embodiment, air-bridge 262 and air-wing 264 are unfilled, i.e., they contain air. In this case, the air-bridge 262 and air-wing 264 are initially filled with sacrificial material (discussed above) during fabrication of the BAW resonator 300, where the sacrificial material is subsequently released using a dry release process, as described above with regard to releasing the sacrificial material from the cavity 108. Since the piezoelectric layer 140 is formed of is formed of LT or LN, it is susceptible to being etched away during a wet release process (i.e., since there is no encapsulant layer on the piezoelectric layer 140). Since there is no cavity in the substrate 105 (such as cavity 108), the dry release process would be performed only to release the sacrificial material from the air-bridge 262 and air-wing 264.

Again, each of the bottom electrode 120 and the top electrode 250 is shown comprised of one material (e.g., Mo or W). However, one or both of the bottom electrode 120 and the top electrode 250 may be a composite electrode, such as bottom electrode 120' and/or the top electrode 150' shown in FIG. 1C, including multiple layers of different conductive materials. That is, the bottom electrode 120 may comprise bottom and top conductive layers (not shown), and/or top electrode 250 may comprise bottom and top conductive layers (not shown), as discussed above, without departing from the scope of the present teachings.

Referring to FIG. 3B, BAW resonator 300' is similar to BAW resonator 300 shown in FIG. 3A, with the addition of the piezoelectric layer being covered by encapsulant layer 145. In particular, the encapsulant layer 145 may be formed on side and top surfaces of piezoelectric layer 140', such that the encapsulant layer 145 protects the LT or LN material of the piezoelectric layer 140' from release solvents previously applied during fabrication to release sacrificial material (discussed above) from within the air-bridge 262 and the air-wing 264. That is, as discussed above, the air-ring 260 is filled with sacrificial material (e.g., $SiO_2$, PSG) during the fabrication process to provide a surface for subsequent application of the outer frame 270', the top electrode 250' and the inner frame 275. After completion of the acoustic stack 210', the sacrificial material in the air-ring 260 (e.g., including the air-bridge 262 and the air-wing 264) may be released using a liquid release solvent, such as HF, since the inclusion of the encapsulant layer 145, along with the bottom electrode 120, surrounds and protects the piezoelectric layer 140' from the release solvent. As mentioned above, because the acoustic mirror 380 is incorporated as the acoustic reflector, as opposed to a cavity (e.g., cavity 108) in the substrate 105, there is no need to release sacrificial material from such a cavity.

Thus, the BAW resonator 300' comprises substrate 105 and acoustic stack 210', in a simplified representation, formed over the acoustic mirror 380 (e.g., DBR). The acoustic stack 210' comprises the bottom electrode 120 and the planarization layer 130 formed over the acoustic mirror 380, the piezoelectric layer 140' formed over the bottom electrode 120 and the planarization layer 130, the encapsulant layer 145 formed over side and top surfaces of the piezoelectric layer 140', and a top electrode 150' formed over the encapsulant layer 145. Accordingly, a barrier is provided around the piezoelectric layer 140' by the encapsulant layer 145 on the top and side surfaces of the piezoelectric layer 140' and on the bottom electrode 120 (and possibly the planarization layer 130, depending on the relative length of the bottom electrode 120) on the bottom surface of the piezoelectric layer 140', thereby protecting the LN or LT material from the release solvents applied to the release the sacrificial material (e.g., in the air-bridge 262 and the air-wing 264). In the depicted embodiment, the outer frame 270' is formed on the top and side surfaces of the encapsulant layer 145, and the inner frame 275 is formed on the top surface of the top electrode 250'. The outer frame 270' also provides structure forming the air-ring 260 (e.g., through application of the outer frame 270' over sacrificial material corresponding to the air-bridge 262 and the air-wing 264, and subsequent release of the sacrificial material).

It is understood that FIGS. 2A, 2B, 3A and 3B provide examples of various combinations of lateral performance enhancement features, and that alternative embodiments are not limited thereto. That is, various different combinations of types and/or numbers of lateral performance enhancement features may be incorporated throughout the acoustic stack, without departing from the scope of the present teachings, e.g., particularly with respect a piezoelectric layer comprising LN or LT, and/or an encapsulant layer protecting the LN or LT piezoelectric layer from release solvent applied during a wet release process. For example, the air-ring may be formed between the bottom electrode and the piezoelectric layer instead of, or in addition to, being formed between the piezoelectric layer and the top electrode; the outer frame may be formed between the bottom electrode and the piezoelectric layer and/or on top of the top electrode instead of, or in addition to, being formed between the piezoelectric layer and the top electrode; and the inner frame may be formed between the bottom electrode and the piezoelectric layer and/or between the piezoelectric layer and the top electrode instead of, or in addition to, being formed on the top electrode. Also, for example, one or more of the exemplary lateral performance enhancement features may not be included. This may result, for example, in inner frame(s) and outer frame(s), but no air-ring(s); inner frame(s) and air-ring(s), but not outer frame(s); or outer frame(s) and air-ring(s), but not inner frame(s).

Figure 4:
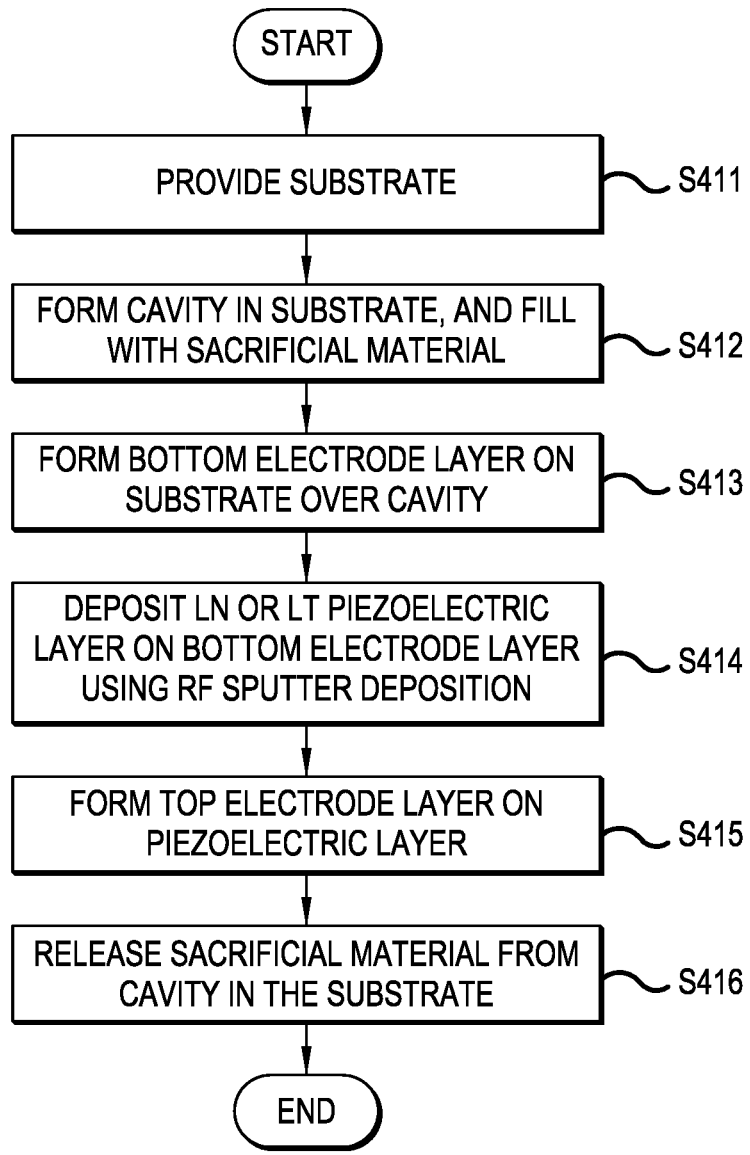
FIG. 4 is a flow diagram depicting a method of fabricating a BAW resonator with a piezoelectric layer comprising LN or LT, according to a representative embodiment.

FIG. 4 is a flow diagram depicting a method of fabricating a BAW resonator with a piezoelectric layer comprising LN or LT, according to a representative embodiment.

Referring to FIG. 4, a substrate is provided in block S411. The substrate may be formed of various types of semiconductor materials compatible with semiconductor processes, such as Si, GaAs, InP, or the like.

In block S412, a cavity is formed in the substrate, and filled with sacrificial material. The cavity may be formed using well known photolithographic techniques, such as coating the substrate with a layer of photoresist, exposing the photoresist layer using an appropriately patterned photomask, and subsequently developing the photoresist layer to open a window in the photoresist layer through which the cavity is etched using well know etching technologies. The cavity is then filled with a sacrificial material, such as $SiO_2$ or PSG, for example, which is deposited by chemical vapor deposition.

A bottom electrode layer, including at least one electrically conductive material, is deposited over the substrate and the filled cavity in block S413. A planarization layer may optionally be formed over the substrate as well, adjacent to the bottom electrode layer, as discussed above with reference to the planarization layer 130. The bottom electrode layer may be formed of a conductive material (e.g., a metal), such as Mo or W, for example, and may be applied using chemical vapor deposition (CVD) or radio-frequency (RF) sputter deposition processes, for example. In alternative embodiments, the bottom electrode layer may provide a composite bottom electrode comprising at least two different conductive materials, as discussed above. In this case, the conductive layers of bottom electrode may be formed of materials that have acoustic impedances that inversely proportionally to their distances from (the subsequently applied) piezoelectric layer. For example, when the bottom electrode layer has two different conductive layers, a bottom conductive layer may be formed of a material having relatively high acoustic impedance, such as W or Ir, and the top conductive layer may be formed of a material having relatively low acoustic impedance, such as Mo or Nb. Various alternative materials that can be used as the bottom and top conductive layers (in addition to or instead of those mentioned above), such as Al, Pt, Ru, or Hf, for example.

In step S414, a piezoelectric layer, comprising one of LN material or LT material, is deposited over the bottom electrode layer, e.g., using a radio frequency (RF) sputter deposition process. The RF sputter deposition to a desired thickness results in a polycrystalline layer of LN or LT, where crystal columns of the LN or LT are substantially aligned in parallel to each other and have corresponding c-axes oriented substantially perpendicular to a top surface of the bottom electrode layer. The RF sputter deposition process may generally include providing a target comprising one of the LN or LT material inside a reaction chamber; providing an argon (Ar) gas atmosphere, with or without oxygen (O), inside the reaction chamber; and applying AC power to create Ar plasma or Ar/O plasma with which the target reacts, resulting in sputter deposition of the LN or LT material, respectively, on the bottom electrode layer. The RF sputter deposition process may be performed an elevated substrate temperature, for example. Alternatively, the RF sputter deposition process may be performed at low temperature followed by thermal annealing.

A top electrode layer, including at least one electrically conductive material, is deposited on the piezoelectric layer in block S415. The top electrode layer may be formed of a conductive material (e.g., a metal), such as molybdenum (Mo) or tungsten (W), for example, and may be applied using CVD or RF sputter deposition processes, for example. In alternative embodiments, the top electrode layer may provide a composite top electrode comprising at least two different conductive materials, as discussed above with reference to the bottom electrode layer. In this case, the conductive layers of bottom electrode may be formed of materials that have acoustic impedances that inversely proportionally to their distances from (the subsequently applied) piezoelectric layer. Examples of the various materials may include W, Ir, Mo, or Nb, Al, Pt, Ru, or Hf. As discussed above, a passivation layer may optionally be formed on the top electrode layer using CVD, for example. The passivation layer may be formed of various types of materials, including AlN, SiC, NEBSG, $SiO_2$, SiN, or polysilicon, for example.

In block S416, the sacrificial material is released from the cavity in the substrate, thereby forming an air cavity below the bottom electrode layer. In the depicted embodiment, releasing the sacrificial material from the cavity includes performing a dry release process, since a wet release process involves application of and/or immersion in a release solvent that would remove at least portion of the LN or LT material of piezoelectric layer. Notably, in embodiments that include BAW resonators having sacrificial material in locations in addition to (or other than) the cavity, such as sacrificial material applied during formation of air-bridges and/or air-wings as lateral performance enhancement features, for example, this additional sacrificial material may also be released during the same dry release process depicted in block S416.

Figure 5:
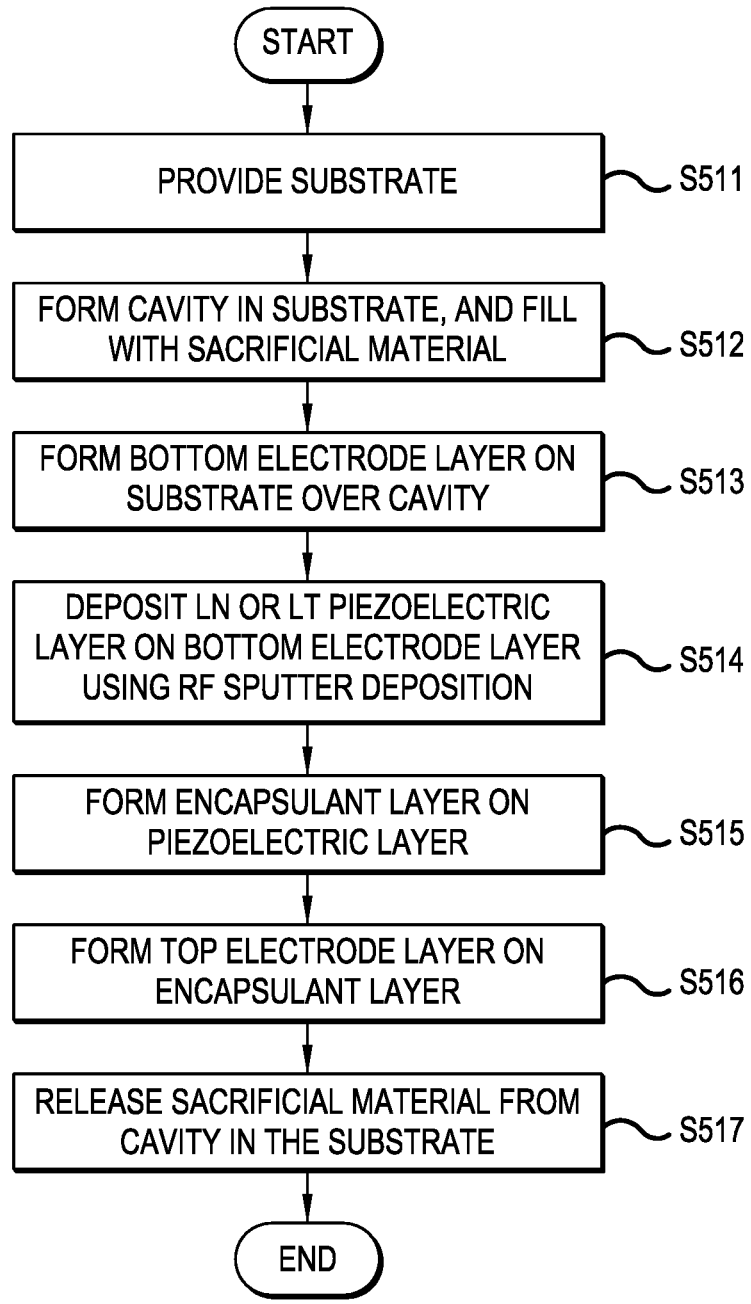
FIG. 5 is a flow diagram depicting a method of fabricating a BAW resonator with an encapsulated piezoelectric layer comprising LN or LT, according to a representative embodiment.

FIG. 5 is a flow diagram depicting a method of fabricating a BAW resonator with an encapsulated piezoelectric layer comprising LN or LT, according to a representative embodiment. The method depicted by FIG. 5 is similar to that depicted by FIG. 4, with the additional step of applying an encapsulant layer to a piezoelectric layer, as shown in FIGS. 1D, 2B and 3B, for example.

Referring to FIG. 5, a substrate is provided in block S511. The substrate may be formed of various types of semiconductor materials compatible with semiconductor processes, such as Si, GaAs, InP, or the like. In block S512, a cavity is formed in the substrate, and filled with sacrificial material, as discussed above with reference to block S412. A bottom electrode layer, including at least one electrically conductive material, is deposited over the substrate and the filled cavity in block S513. A planarization layer may optionally be formed over the substrate as well, adjacent to the bottom electrode layer, as discussed above with reference to the planarization layer 130. The bottom electrode layer may be formed of a conductive material (e.g., a metal), such as Mo or W, for example, and may be applied using CVD or RF sputter deposition processes, for example. In alternative embodiments, the bottom electrode layer may provide a composite bottom electrode comprising at least two different conductive materials, as discussed above with reference to block S413.

In step S514, a piezoelectric layer, comprising one of LN material or LT material, is deposited over the bottom electrode layer, e.g., using a RF sputter deposition process. The RF sputter deposition to a desired thickness results in a polycrystalline layer of LN or LT, where crystal columns of the LN or LT are substantially aligned in parallel to each other and have corresponding c-axes oriented substantially perpendicular to a top surface of the bottom electrode layer. An illustrative RF sputter deposition process is described above with reference to step S414. In an embodiment, the piezoelectric layer may be formed with sloped side-walls. The sloped side-walls are formed by a reactive ion etch process, for example.

In step S515, an encapsulant layer is formed over side and top surfaces of the piezoelectric layer. The encapsulant layer may be applied using CVD, for example, and may have a more even distribution across the side and top surfaces when the piezoelectric layer has sloped side-walls, as mentioned above. The encapsulant layer may be formed of various types of dielectric materials, such as SiC or NEBSG, resistant to release solvents, such as HF.

A top electrode layer, including at least one electrically conductive material, is deposited over the encapsulant layer in block S516. The top electrode layer may be formed of a conductive material (e.g., a metal), such as Mo or W, for example, and may be applied using CVD or RF sputter deposition processes, for example. In alternative embodiments, the top electrode layer may provide a composite top electrode comprising at least two different conductive materials, as discussed above. A passivation layer may optionally be formed over the top electrode layer using CVD or RF sputter deposition processes, for example.

In block S517, the sacrificial material is released from the cavity in the substrate, thereby forming an air cavity below the bottom electrode layer. In the depicted embodiment, releasing the sacrificial material from the cavity may include performing a wet release process, since the LN or LT piezoelectric layer is encapsulated by the encapsulant layer and the bottom electrode layer. This protects the LN or LT material of the piezoelectric layer from the release solvent used for the wet release process, whether by application of or immersion in the release solvent. A dry release process may be incorporated in the alternative, in which case the encapsulant layer would not necessarily be required. Notably, in embodiments that include BAW resonators having sacrificial material in locations in addition to (or other than) the cavity, such as sacrificial material applied during formation of air-bridges and/or air-wings as lateral performance enhancement features, for example, this additional sacrificial material may also be released during the same wet (or dry) release process depicted in block S517.

While example embodiments are disclosed herein, one of ordinary skill in the art appreciates that many variations that are in accordance with the present teachings are possible and remain within the scope of the appended claims. For example, different set of metals may be used in top and bottom electrodes. In another example, replacement fraction of one metal with another metal may be different in top electrode from replacement fraction in the bottom electrode. The embodiments therefore are not to be restricted except within the scope of the appended claims.

The invention claimed is:

1. A bulk acoustic wave (BAW) resonator comprising:
a substrate;
an acoustic reflecting feature on or in the substrate;
bottom electrode disposed over the acoustic reflecting feature;
a piezoelectric layer disposed over the bottom electrode, the piezoelectric layer comprising one of polycrystalline lithium niobate (LN) material or polycrystalline lithium tantalate (LT) material;
an encapsulant layer formed over side and top surfaces of the piezoelectric layer, the encapsulant layer and the bottom electrode encapsulating the piezoelectric layer; and
a top electrode disposed over the piezoelectric layer and the encapsulant layer.

2. The BAW resonator of claim 1, wherein the encapsulant layer comprises a dielectric material.

3. The BAW resonator of claim 2, the dielectric material comprises silicon carbide (SiC) or non-etchable boron-doped silicon glass (NEBSG).

4. The BAW resonator of claim 1, wherein the acoustic reflecting feature comprises a cavity formed in the substrate.

5. The BAW resonator of claim 1, further comprising:
at least one lateral performance enhancement feature in the top electrode.

6. The BAW resonator of claim 5, wherein the acoustic reflecting feature comprises an acoustic morror formed on the substrate.

7. The BAW resonator of claim 6, wherein the at least one lateral performance enhancement feature comprises at least one of an air-bridge or an air-wing.

8. The BAW resonator of claim 6, wherein the at least one lateral performance enhancement feature comprises one of an inner frame or an outer frame.

9. The BAW resonator of claim 6, wherein the acoustic mirror comprises a distributed Bragg reflector.

10. The BAW resonator of claim 1, further comprising:
at least one lateral performance enhancement feature in the bottom electrode.

11. A bulk acoustic wave (BAW) resonator comprising:
a substrate;
an acoustic mirror formed over the substrate;
a bottom electrode disposed over the acoustic mirror;
a piezoelectric layer disposed over the bottom electrode, the piezoelectric layer comprising polycrystalline lithium niobate (LN) material;
an encapsulant layer formed over side and top surfaces of the piezoelectric layer, the encapsulant layer and the bottom electrode encapsulating the piezoelectric layer; and
a top electrode disposed over the piezoelectric layer and the encapsulant layer, the top electrode including at least one lateral performance enhancement feature.

12. The BAW resonator of claim 11, wherein the LN material is formed of LN crystal columns substantially aligned in parallel to each other, and
wherein each of the LN crystal columns has a c-axis oriented substantially perpendicular to a top surface of the bottom electrode.

13. The BAW resonator of claim 11, wherein the encapsulant layer comprises dielectric material.

14. The BAW resonator of claim 13, wherein the dielectric material comprises silicon carbide (SiC) or non-etchable boron-doped silicon glass (NEBSG).

15. The BAW resonator of claim 12, wherein the at least one lateral performance enhancement feature comprises at least one of an air-bridge or an air-wing.

16. A bulk acoustic wave (BAW) resonator comprising:
a substrate;
an acoustic mirror formed over the substrate;
a bottom electrode disposed over the acoustic mirror;
a piezoelectric layer disposed over the bottom electrode, the piezoelectric layer comprising polycrystalline lithium tantalate (LT) material;
an encapsulant layer formed over side and top surfaces of the piezoelectric layer, the encapsulant layer and the bottom electrode encapsulating the piezoelectric layer; and
a top electrode disposed over the piezoelectric layer, the top electrode including at least one lateral performance enhancement feature.

17. The BAW resonator of claim 16, wherein the, 3 is formed of LT crystal columns substantially aligned in parallel to each other, and
wherein each of the LT crystal columns has a c-axis oriented substantially perpendicular to a top surface of the bottom electrode.

18. The BAW resonator of claim 16, wherein the encapsulant layer comprises dielectric material.

19. The BAW resonator of claim 18, the dielectric material comprises silicon carbide (SiC) or non-etchable boron-doped silicon glass (NEBSG).

20. The BAW resonator of claim 16, wherein the at least one lateral performance enhancement feature comprises at least one of an air-bridge or an air-wing.

* * * * *